(12) United States Patent
Tanigawa et al.

(10) Patent No.: US 7,057,829 B2
(45) Date of Patent: Jun. 6, 2006

(54) LENS BARREL AND IMAGING APPARATUS

(75) Inventors: Kouichi Tanigawa, Kagoshima (JP); Tetsuo Hayashi, Gifu (JP)

(73) Assignee: Sony Corporation (JP)

( * ) Notice: Subject to any disclaimer, the term of this patent is extended or adjusted under 35 U.S.C. 154(b) by 36 days.

(21) Appl. No.: 10/959,141

(22) Filed: Oct. 7, 2004

(65) Prior Publication Data
US 2005/0083590 A1   Apr. 21, 2005

(30) Foreign Application Priority Data
Oct. 20, 2003  (JP) .......................... P2003-359894

(51) Int. Cl.
*G02B 15/14* (2006.01)
(52) U.S. Cl. ..................... 359/704; 396/542
(58) Field of Classification Search ................ 359/819, 359/704; 396/542
See application file for complete search history.

(56) References Cited

U.S. PATENT DOCUMENTS 6,002,437 A * 12/1999 Morioka et al. ............ 348/373
6,654,064 B1 * 11/2003 Ishikawa ..................... 348/374
6,898,030 B1 *  5/2005 Lin et al. ..................... 359/819
6,956,615 B1 * 10/2005 Nakagishi et al. .......... 348/374

* cited by examiner

*Primary Examiner*—Ricky Mack
*Assistant Examiner*—Jessica Stultz
(74) *Attorney, Agent, or Firm*—Rader, Fishman & Grauer PLLC; Ronald P. Kananen

(57) ABSTRACT

A lens barrel and an imaging apparatus is provided for securely connecting an imaging element with an imaging circuit and advantageous in terms of downsizing of devices. A plurality of first connecting terminals is provided to a bottom face of an imaging element package. A flexible circuit board is constituted by an imaging element mounting section, an extending section and a connecting section. The imaging element mounting section includes a flexible circuit board and a plurality of second connecting terminals provided on a surface of the flexible circuit board so that each of the second connecting terminals match with a corresponding first connecting terminal. A metal plate is mounted at a position where the outline of the metal plate matches the outline of the package or the outline of the package is placed in the outline of the metal plate as viewed from the thicknesswise direction of the package, on the rear face of the imaging-element mounting section.

6 Claims, 24 Drawing Sheets

FIG. 8
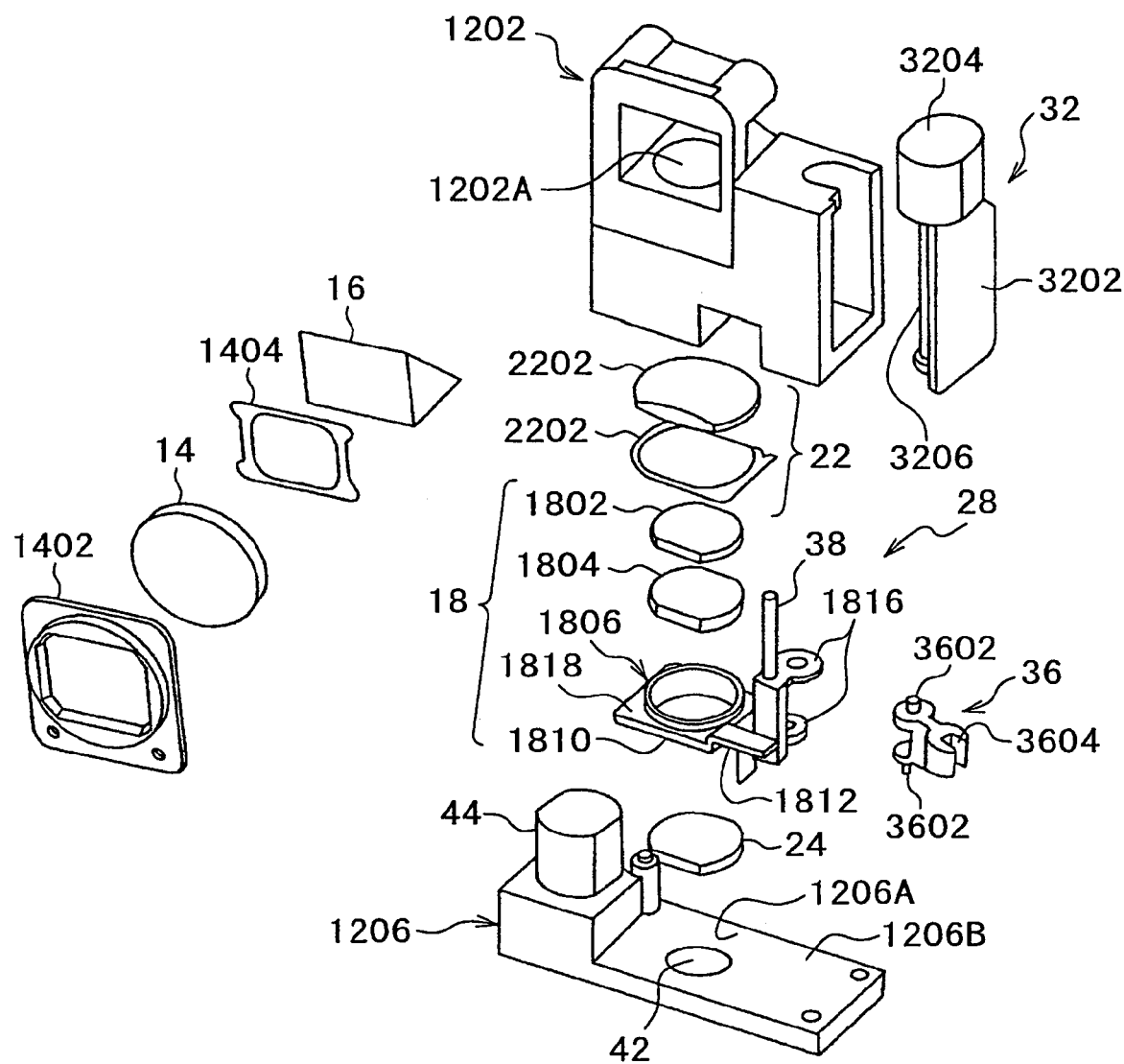
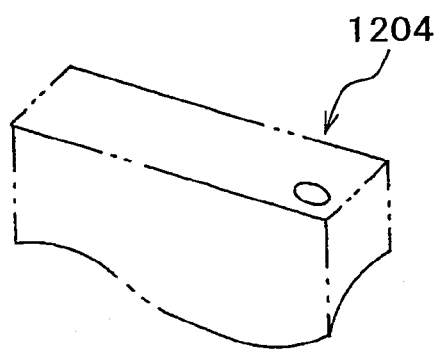

FIG. 25
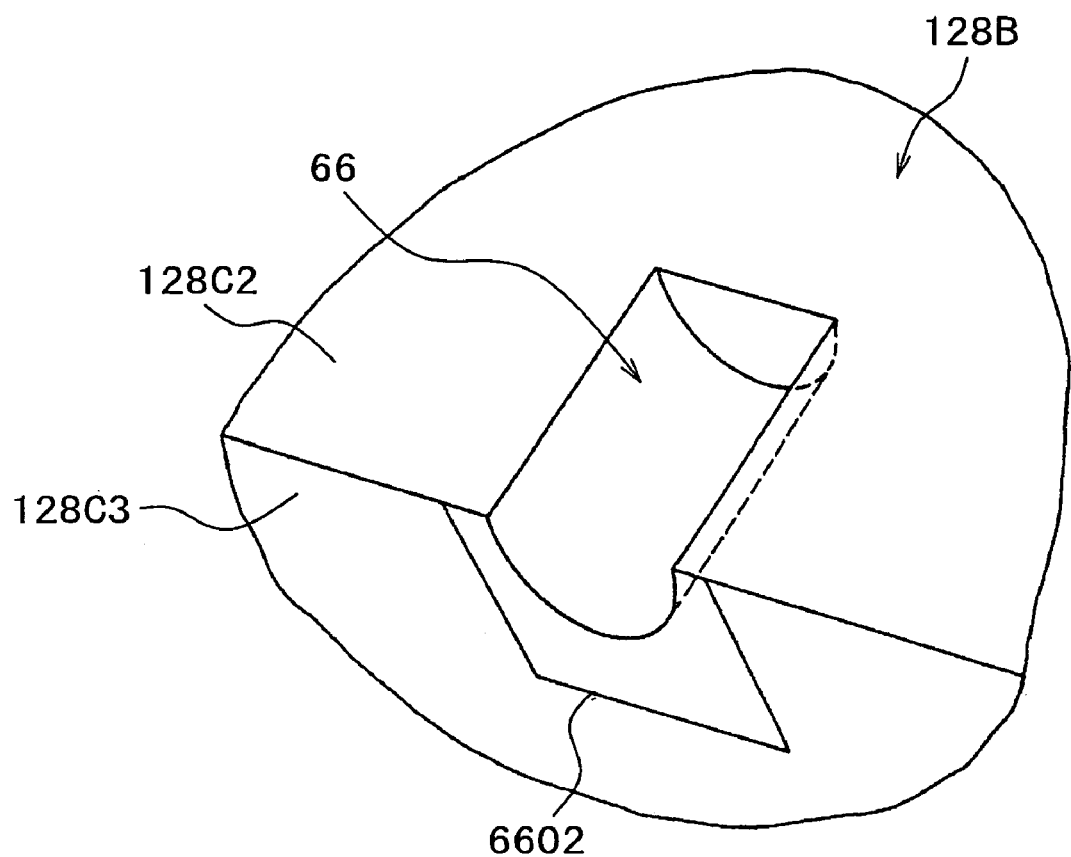
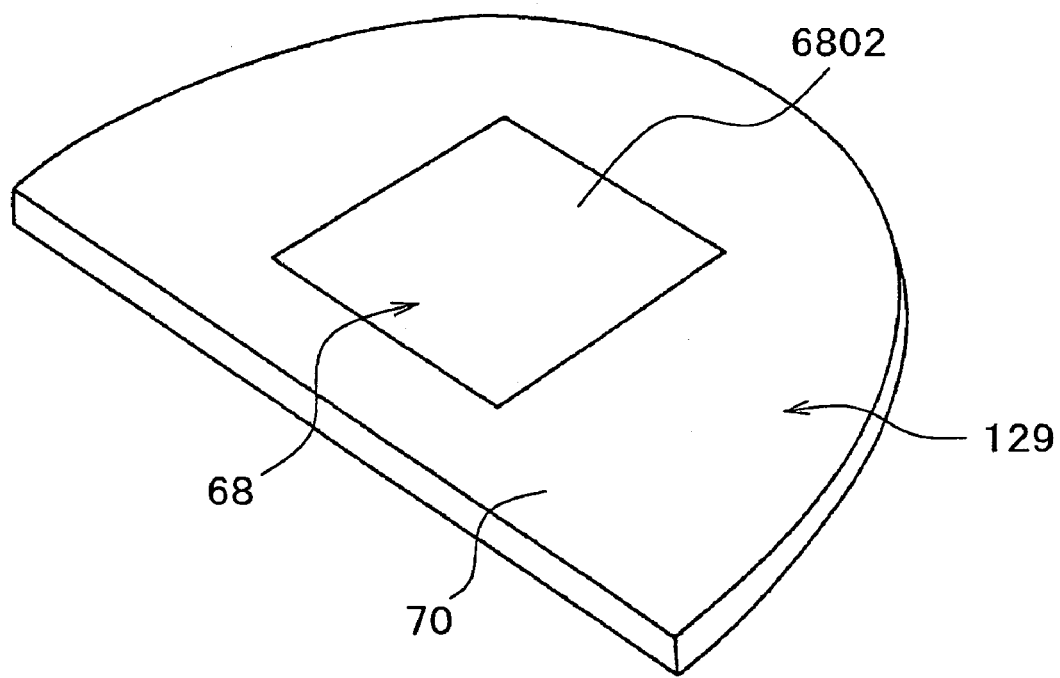

LENS BARREL AND IMAGING APPARATUS

CROSS REFERENCE TO RELATED APPLICATIONS

The present document claims benefit of Japanese Priority Document JP2003-359894, filed in the Japanese Patent Office on Oct. 20, 2003, the contents of which being incorporated herein by reference to the extent permitted by law.

BACKGROUND OF THE INVENTION

1. Field of the Invention

The present invention relates to a lens barrel and an imaging apparatus.

2. Related Art

Lens barrels of the type in which imaging elements are incorporated into barrels have heretofore been provided.

In this type of lens barrel and in many cases, the connecting terminals of an imaging element are connected to a hard printed circuit board by soldering, and the printed circuit board and an imaging circuit provided outside the barrel are interconnected via a flexible printed circuit board.

Driving signals are supplied from the imaging circuit to the imaging element via a wiring member made of these printed circuit board and flexible printed circuit board, and captured image signals outputted from the imaging element are transmitted to the imaging circuit, as described, for example, in Japanese Laid-Open Patent JP-A-10-336496.

SUMMARY OF THE INVENTION

In recent years, there has been a demand to miniaturize lens barrels and imaging apparatuses. However, in a related art type of lens barrel, two members such as a hard printed circuit board and a flexible printed circuit board are needed as wiring members for interconnecting an imaging element and an imaging circuit, and if the imaging element is to be miniaturized with the miniaturization of lens barrels and imaging apparatuses, there is the disadvantage that the two members occupy a space and hinder the miniaturization of the imaging element.

There is a method of directly soldering an imaging element to a flexible printed circuit board without using a hard printed circuit board, but if the flexible printed circuit board itself is to be miniaturized with the miniaturization of lens barrels and imaging apparatuses, there occurs the disadvantage that the flexible printed circuit board cannot provide a reliable interconnection between the imaging element and an imaging circuit, because the flexible printed circuit board has the nature that when the area of the flexible printed circuit board is small, the deformation thereof is promoted by heat applied to the flexible printed circuit board during soldering.

The present invention has been conceived in view of these problems, and a preferred embodiment of the present invention aims at providing a lens barrel and an imaging apparatus both of which able to interconnect an imaging element and an imaging circuit reliably and which are advantageous in terms of miniaturization.

A preferred embodiment of the present invention provides a lens barrel which has an optical system provided inside a barrel and operative to guide a subject image, an imaging element provided on an optical path of the optical system inside the barrel, and a flexible printed circuit board connected to the imaging element and operative to perform transmission of signals between the imaging element and an imaging circuit provided outside the barrel, and the lens barrel is characterized in that the imaging element is constructed including a package having a plate-like shape, an imaging unit housed in the package so as to face an obverse face of the package, and a plurality of first connecting terminals provided on a rear face of the package, in that the flexible printed circuit board is constructed including an imaging-element mounting section, an extending section extended from the imaging-element mounting section, and a connecting section provided at an extending end of the extending section and connected to the imaging circuit, in that the imaging-element mounting section has a plurality of second connecting terminals provided on a surface of the flexible printed circuit board so as to correspond to the respective first connecting terminals, in that the package is mounted on the imaging-element mounting section with the first connecting terminals respectively connected to the second connecting terminals by soldering, in that a metal plate is provided which, as viewed in a direction of thickness of the package, has an outline which is approximately the same as the package, or an outline which is made larger than that of the package so that the outline of the package is contained in that of the metal plate, the metal plate having the nature of retaining its rigidity at a temperature of heating by which each of the first connecting terminals and the corresponding one of the second connecting terminals are being soldered, and in that the metal plate is mounted at a position where the outline of the metal plate coincides with the outline of the package or the outline of the package is placed in the outline of the metal plate, as viewed in the thicknesswise direction of the package, on the rear face of the imaging-element mounting section.

Another preferred embodiment of the present invention provides an imaging apparatus including a lens barrel which has an optical system provided inside a barrel and operative to guide a subject image, an imaging element provided on an optical path of the optical system inside the barrel, and a flexible printed circuit board connected to the imaging element and operative to perform transmission of signals between the imaging element and an imaging circuit provided outside the barrel, and the imaging apparatus is characterized in that the imaging element is constructed including a package having a plate-like shape, an imaging unit housed in the package so as to face an obverse face of the package, and a plurality of first connecting terminals provided on a rear face of the package, in that the flexible printed circuit board is constructed including an imaging-element mounting section, an extending section extended from the imaging-element mounting section, and a connecting section provided at an extending end of the extending section and connected to the imaging circuit, in that the imaging-element mounting section has a plurality of second connecting terminals provided on a surface of the flexible printed circuit board so as to correspond to the respective first connecting terminals, in that the package is mounted on the imaging-element mounting section with the first connecting terminals respectively connected to the second connecting terminals by soldering, in that a metal plate is provided which, as viewed in a thicknesswise direction of the package, has an outline which is approximately the same as the package, or an outline which is made larger than that of the package so that the outline of the package is contained in that of the metal plate, the metal plate having the nature of retaining its rigidity at a temperature of heating by which each of the first connecting terminals and the corresponding one of the second connecting terminals are being soldered, and in that the metal plate is mounted at a position where the outline of the metal plate coincides with the outline of the package or the outline of the package is placed in the outline of the metal plate, as viewed in the thicknesswise direction of the package, on the rear face of the imaging-element mounting section.

According to the preferred embodiments of the present invention, the metal plate is mounted on the rear face of the part of the flexible printed circuit board on which the imaging element is mounted. As a result, although the package of the imaging element and the part of the flexible printed circuit board which constitutes the imaging-element mounting section is reduced to a considerably reduced size, the part of the flexible printed circuit board which constitutes the imaging-element mounting section does not undergo deformation even if the part of the flexible printed circuit board is heated during soldering between the first connecting terminals and the second connecting terminals, whereby the first connecting terminals and the second connecting terminals can be reliably soldered to one another and the imaging element and an image processing unit can be reliably interconnected. Accordingly, the present invention is also advantageous in terms of miniaturization.

BRIEF DESCRIPTION OF THE DRAWINGS

The above and other objects and features of the preferred embodiments of the present invention will become more apparent to those of ordinary skill in the art from the following detailed description taken in conjunction with the accompanying drawings in which:

FIG. 8 shows an exploded perspective view showing a partial construction of the lens barrel 10;

FIG. 25 shows an explanatory view of the first connecting terminal 66 of the imaging element 128 and the second connecting terminal 68 of the flexible printed circuit board 129;

DETAILED DESCRIPTION OF THE PREFERRED EMBODIMENTS OF THE INVENTION

The pursuit of miniaturization, while ensuring a reliable connection between an imaging element and an imaging circuit, is attempted by mounting a metal plate on a rear face of the part of a flexible printed circuit board on which the imaging element is mounted.

Example of preferred embodiment 1

An example of preferred embodiment 1 of the present invention will be described below with reference to the accompanying drawings.

In the present example of the preferred embodiment, reference will be made to a case where a lens barrel according to the present invention is incorporated in an imaging apparatus.

Figure 1:
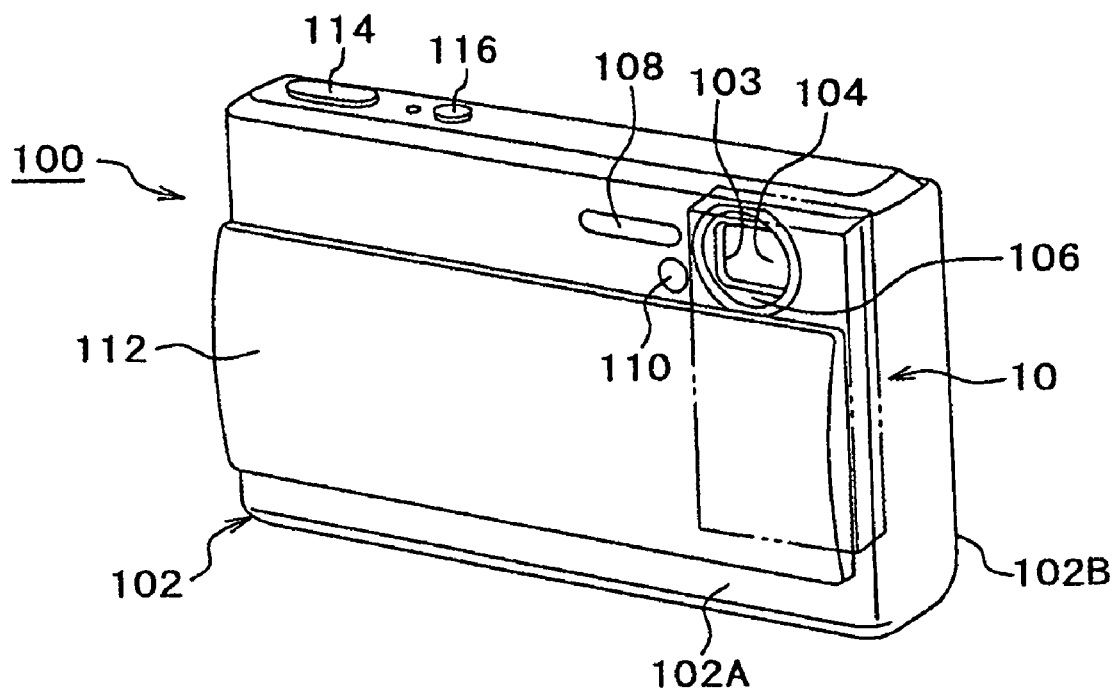
FIG. 1 shows a perspective view of an imaging apparatus according to a preferred embodiment of the present invention as viewed from a front side thereof.
Figure 2:
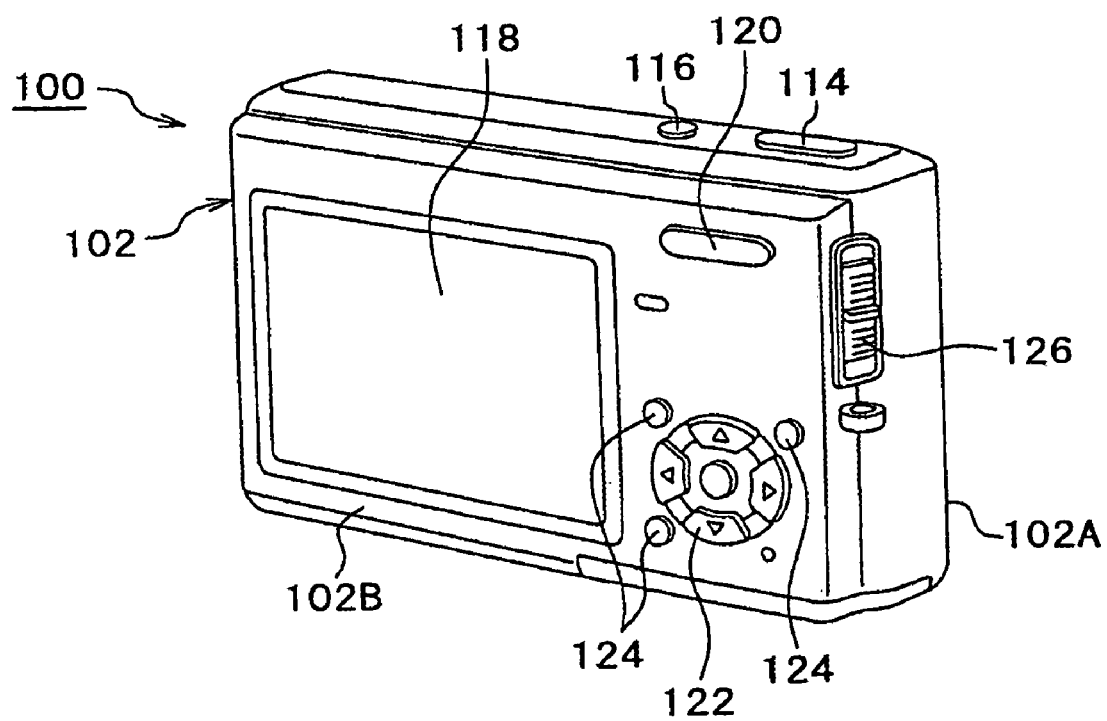
FIG. 2 shows a perspective view of the imaging apparatus of the preferred embodiment of the present invention as viewed from a rear side thereof.
Figure 3:
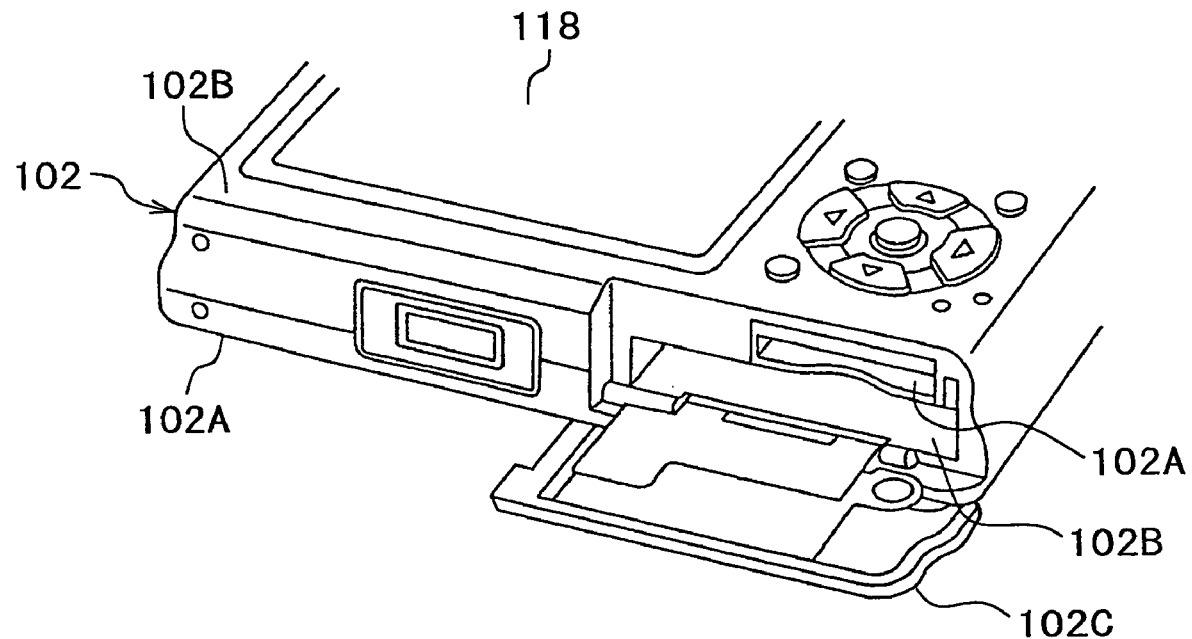
FIG. 3 shows a perspective view of the imaging apparatus of the preferred embodiment of the present invention as viewed from a bottom thereof.
Figure 4:
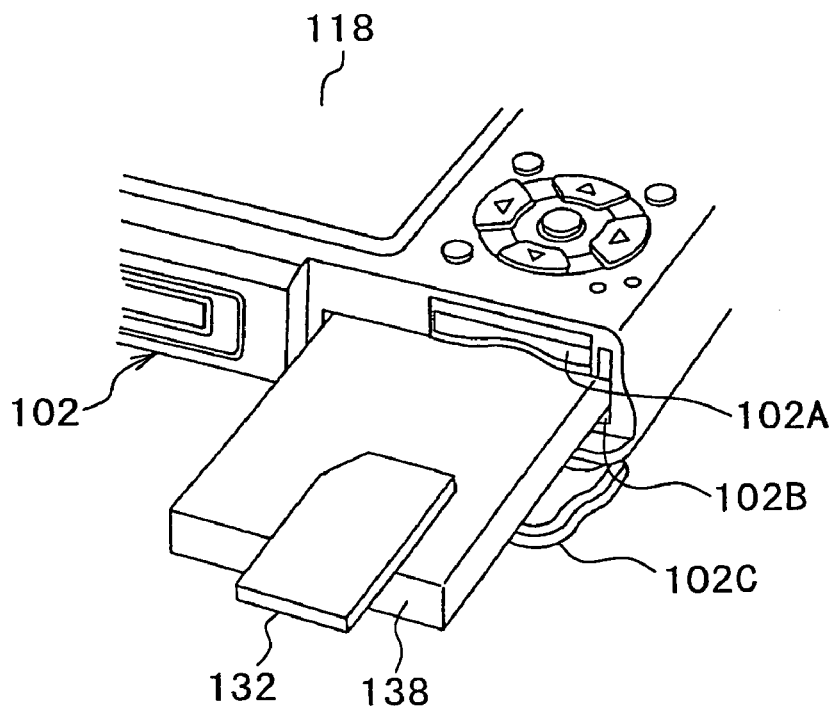
FIG. 4 shows an explanatory view for explaining the state of housing of a memory card and a battery according to a preferred embodiment of the present invention.
Figure 5:
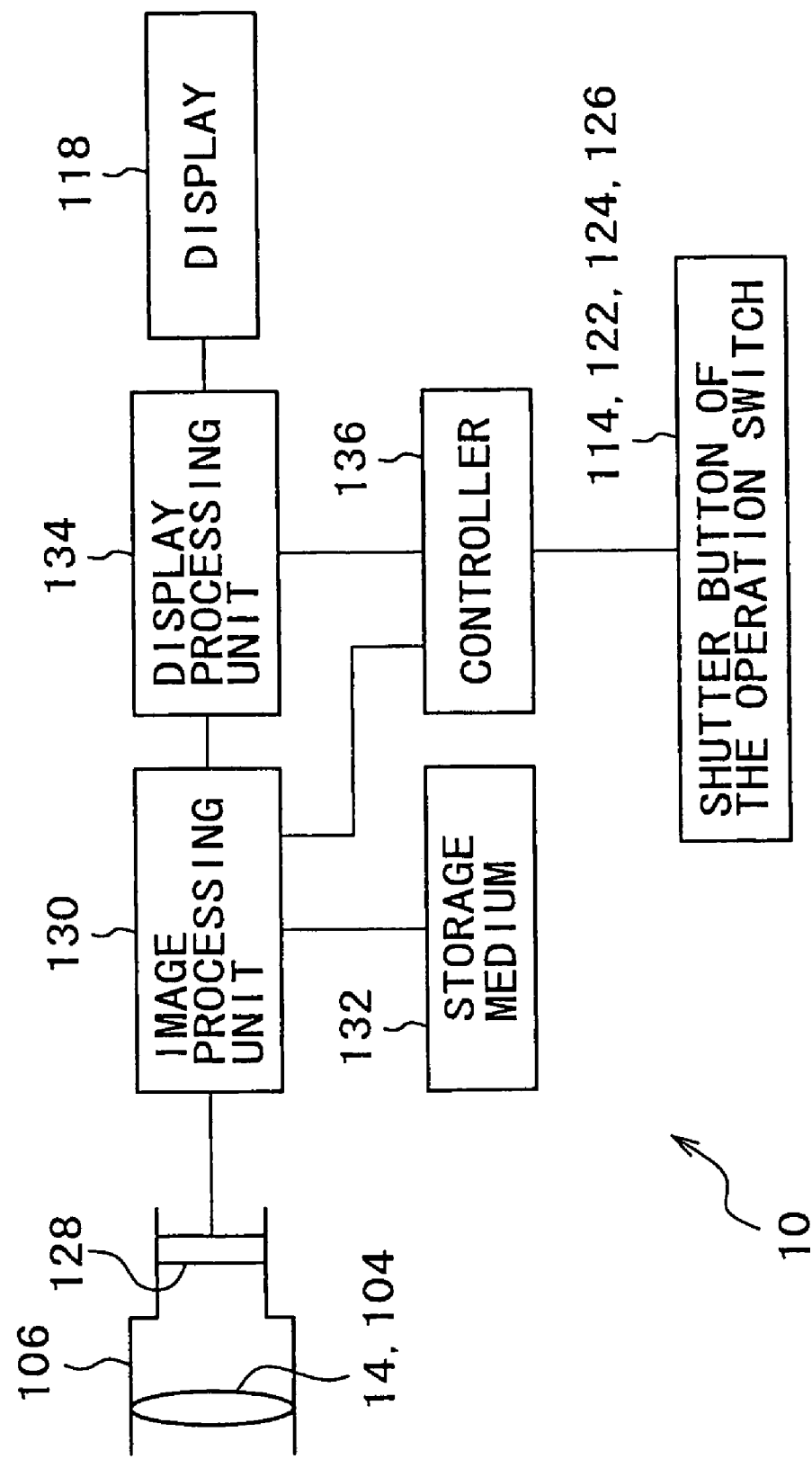
FIG. 5 shows a block diagram showing a control system of the imaging apparatus according to a preferred embodiment of the present invention.

FIG. 1 is a perspective view of an imaging apparatus of the example of the preferred embodiment 1 as viewed from the front side thereof; FIG. 2 is a perspective view of the imaging apparatus of the example of the preferred embodiment 1 as viewed from the rear thereof; FIG. 3 is a perspective view of the imaging apparatus of the example of the preferred embodiment 1 as viewed from the bottom thereof; FIG. 4 is an explanatory view aiding in explaining the state of housing of a memory card and a battery, and FIG. 5 is a block diagram showing a control system of the imaging apparatus.

As shown in FIGS. 1 and 2, an imaging apparatus 100 is a digital still camera, and it has a rectangular plate-shaped case 102 which constitutes an external appearance. The case 102 is made of a combination of a front case 102A and a rear case 102B, and the front face of the case 102 is formed by the front case 102A, while the rear face of the case 102 is formed by the rear case 102B. In the present specification, it is assumed that the right and the left of the case 102 mean those as viewed from the front side of the case 102.

As shown by dot-dot-dashed lines in FIG. 1, a lens barrel 10 according to the present invention is incorporated in a right-hand section of the case 102, and an objective lens 14, an imaging element 128, an optical system 104 for guiding a subject image captured by the objective lens 14 to the imaging element 128, and the like are provided in the lens barrel 10. An optical system as defined by the appended claims is formed by these objective lens 14 and optical system 104.

The objective lens 14 is disposed to face the front side of the case 102 via a lens window 103 provided in the front case 102A.

A flash 108 for emitting image-taking auxiliary light, a self-timer lamp 110 and the like are provided at right-hand locations on the front face of the case 102.

A cover 112 is upwardly and downwardly slidably provided on the front face of the case 102, and this cover 112 is operated to slide between an upper position where the lens window 103, the flash 108 and the self-timer lamp 110 are exposed to the front side, as shown in FIG. 1, and a lower position where the cover 112 covers these lens window 103, flash 108 and the self-timer lamp 110.

A shutter button 114, a power source button 116 and the like are provided at left-hand locations on the top face of the case 102.

Provided on the rear face of the case 102 are a display 118 (a liquid crystal display), which displays images such as still images and moving images, characters, signs and the like, a zoom switch 120 for causing the optical system 104 to perform a zooming operation, and a cross switch 122 and a plurality of operating buttons 124 for effecting various operations.

A mode switch 126 for switching the imaging apparatus 100 to any of the modes such as a still image taking mode, a moving image taking mode and a reproducing/editing mode is provided on the left face of the case 102.

As shown in FIGS. 3 and 4, a memory housing chamber 102A which removably houses a memory card 132 for recording images such as still images and moving images and a battery housing chamber 102B which removably houses a battery 138 serving to constitute a power source of the imaging apparatus 100 are provided on the bottom face of the case 102 in such a manner that the memory housing chamber 102A and the battery housing chamber 102B are arranged in the direction from the rear to the front side (in the thickness direction) of the case 102. These memory housing chamber 102A and battery housing chamber 102B are opened and closed by an opening/closing lid 102C that is connected to the bottom face of the case 102 via a hinge.

As shown in FIG. 5, the imaging element 128 is made of a CCD sensor, a CMOS sensor or the like which picks up a subject image formed by the optical system 104.

The imaging element 128 is constructed to perform an imaging operation in accordance with driving signals supplied from an image processing unit 130 and output an image captured by the imaging element 128 to the image processing unit 130 as a captured image signal. In the present example of the preferred embodiment, an imaging circuit of the present invention is formed by the image processing unit 130.

The image processing unit 130 generates image data representing a still image or a moving image, on the basis of this captured image signal, and records the image data on a memory card (storage medium) 132. In addition, the image data are displayed on the display 118 by a display processing unit 134.

The image captured by the imaging element 128 is outputted to the image processing unit 130 as the captured image signal, and the image processing unit 130 generates the image data representing a still image or a moving image, on the basis of this captured image signal, and records the image data on the memory card (image medium) 132. In addition, the image data are displayed on the display 118 by the display processing unit 134.

The imaging apparatus 100 further had a controller 136 including a CPU and the like for controlling the image processing unit 130 and the display processing unit 134 in accordance with operations of the shutter button 114, the cross switch 122, the operating buttons 124 and the mode switch 126.

Figure 6:
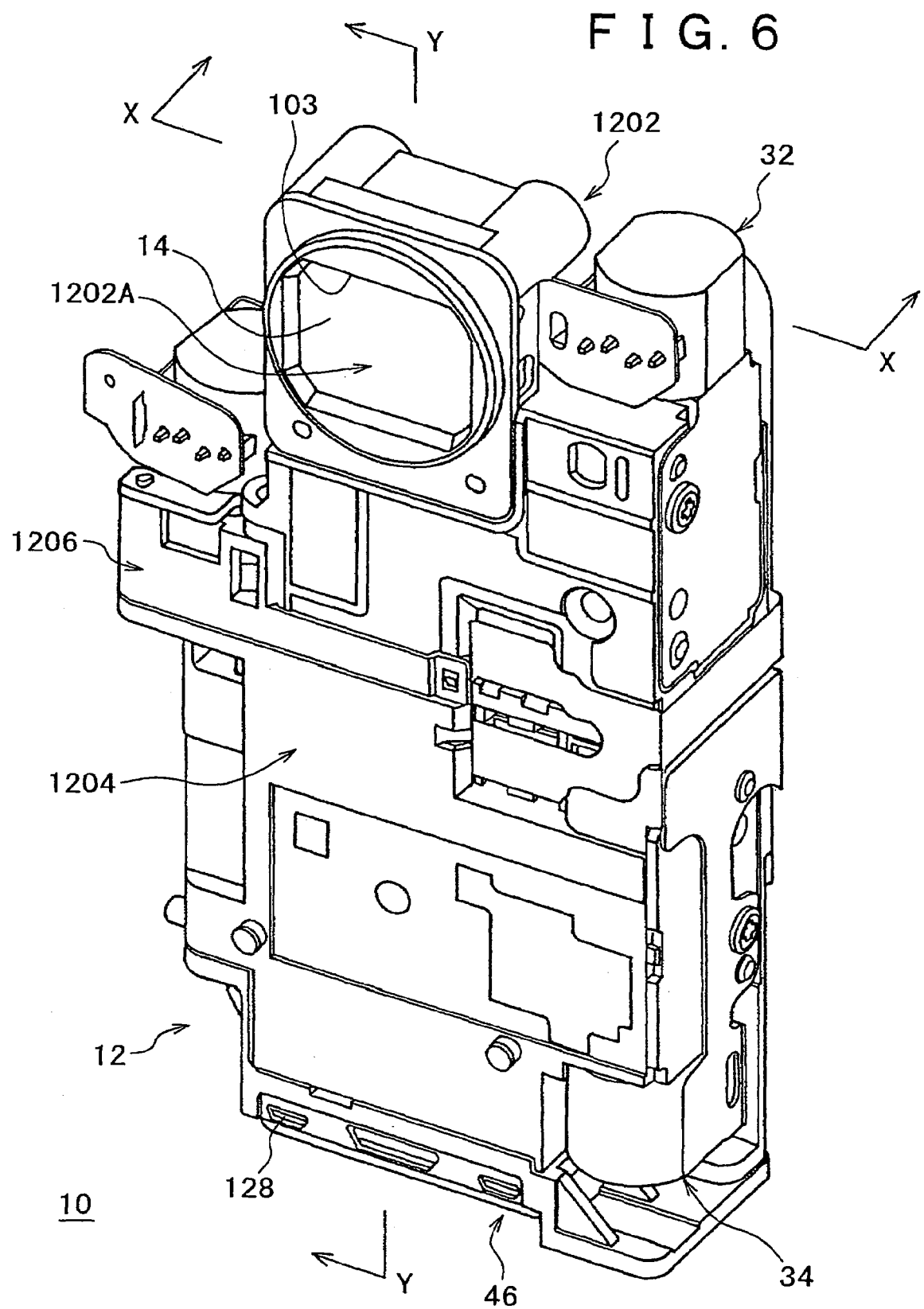
FIG. 6 shows a perspective view of the lens barrel 10 as viewed obliquely from the front side.
Figure 7:
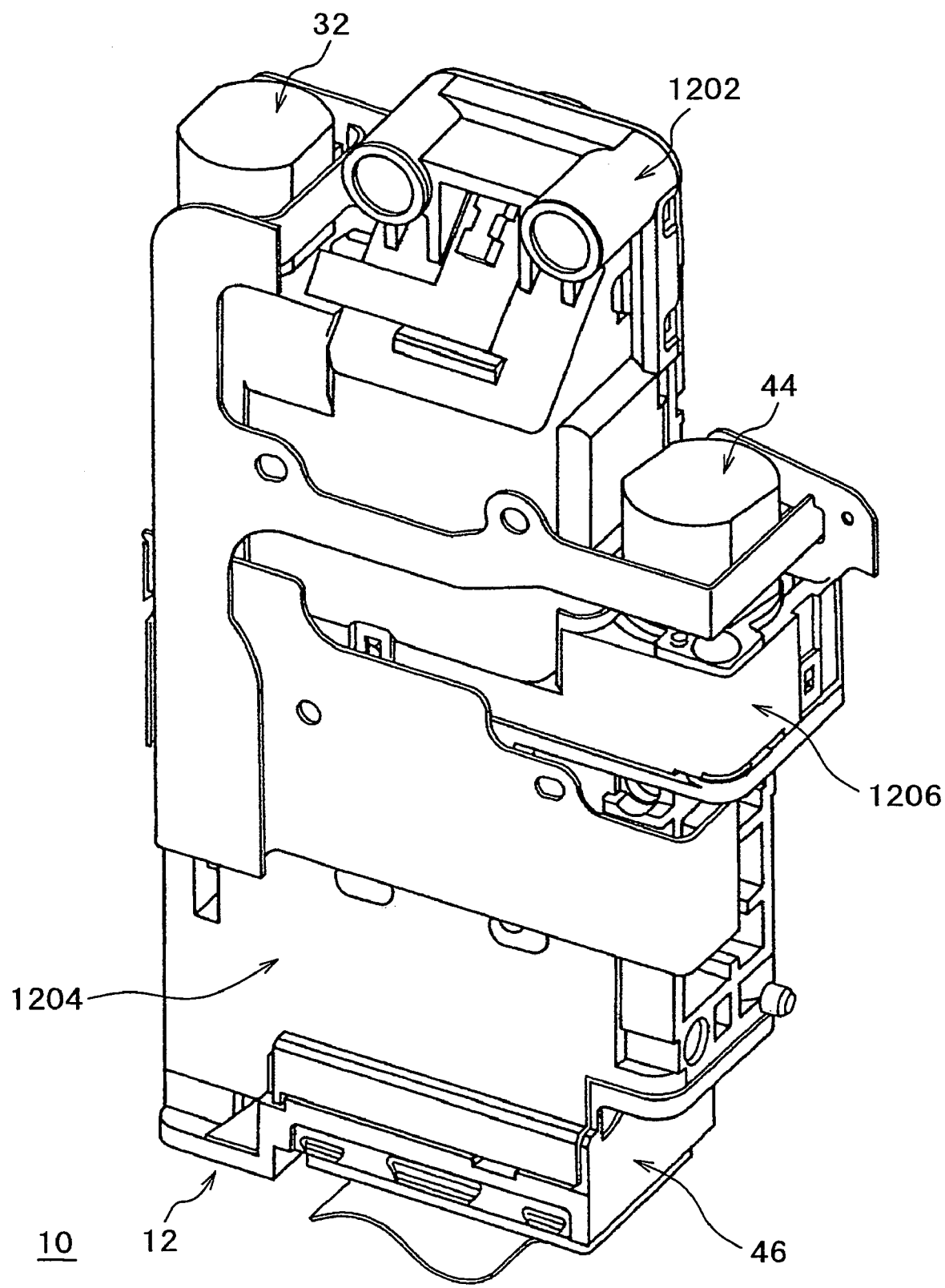
FIG. 7 shows a perspective view of the lens barrel 10 as viewed obliquely from the rear side.
Figure 9:
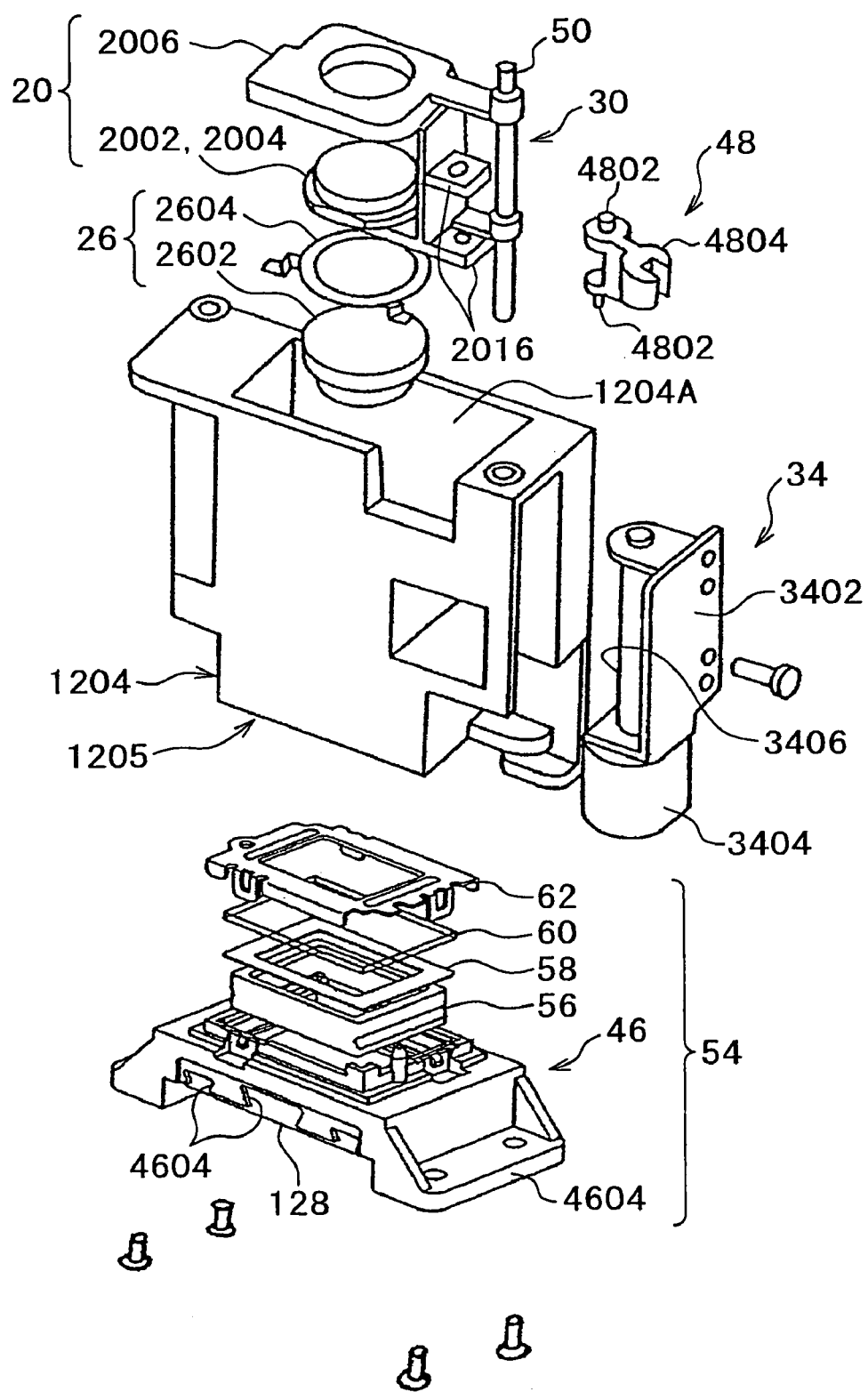
FIG. 9 shows an exploded perspective view showing the remaining construction of the lens barrel 10.
Figure 10:
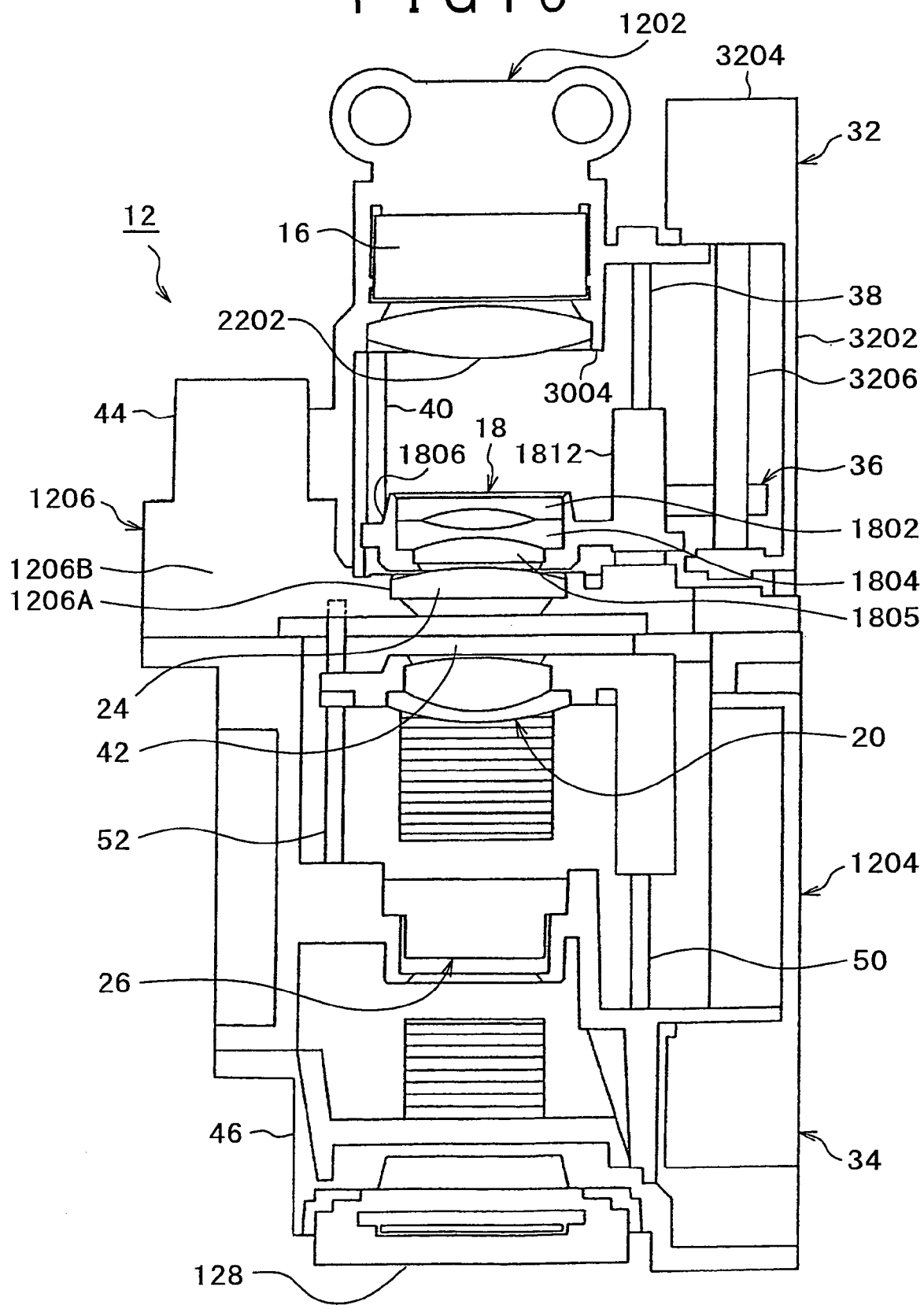
FIG. 10 shows a cross-sectional view taken along line X—X of FIG. 6.
Figure 11:
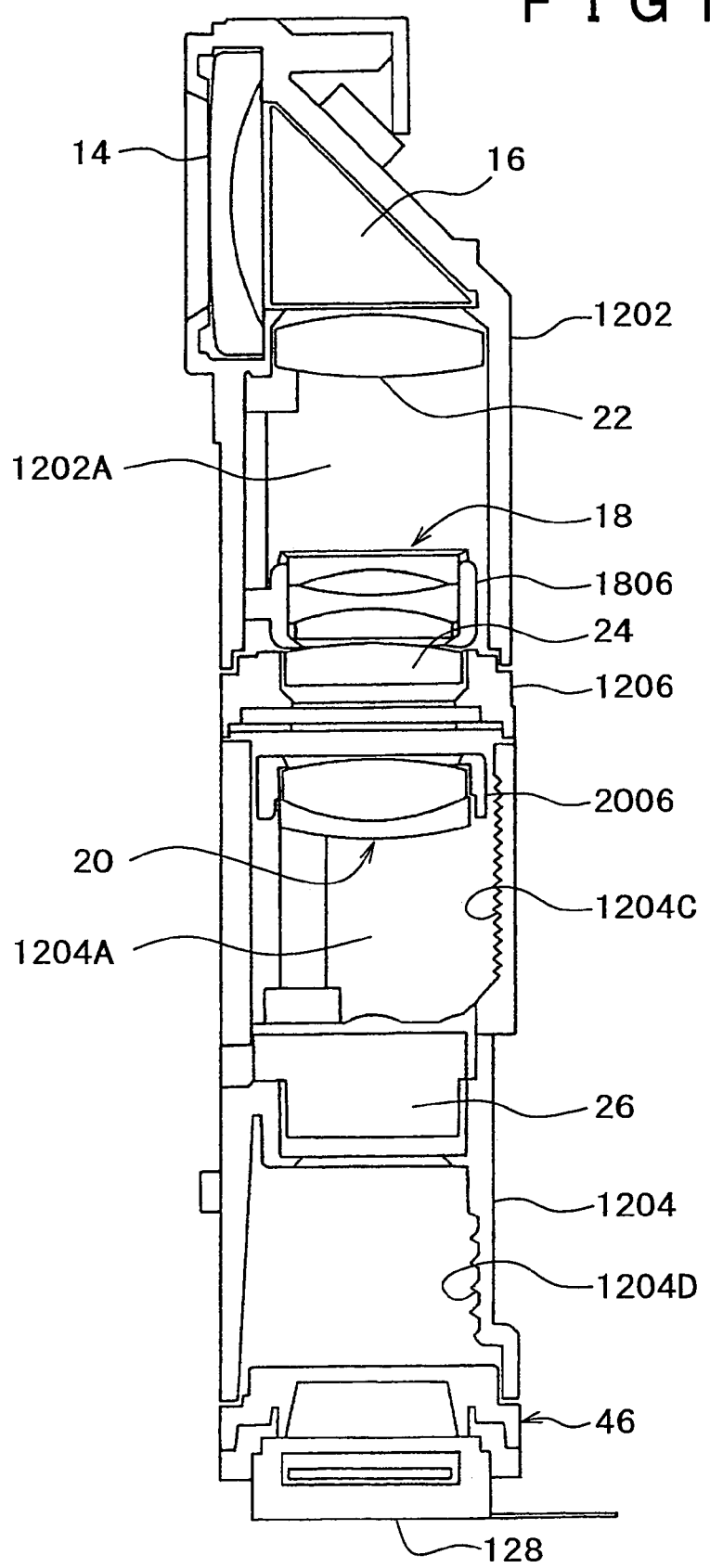
FIG. 11 shows a cross-sectional view taken along line Y—Y of FIG. 6.
Figure 12:
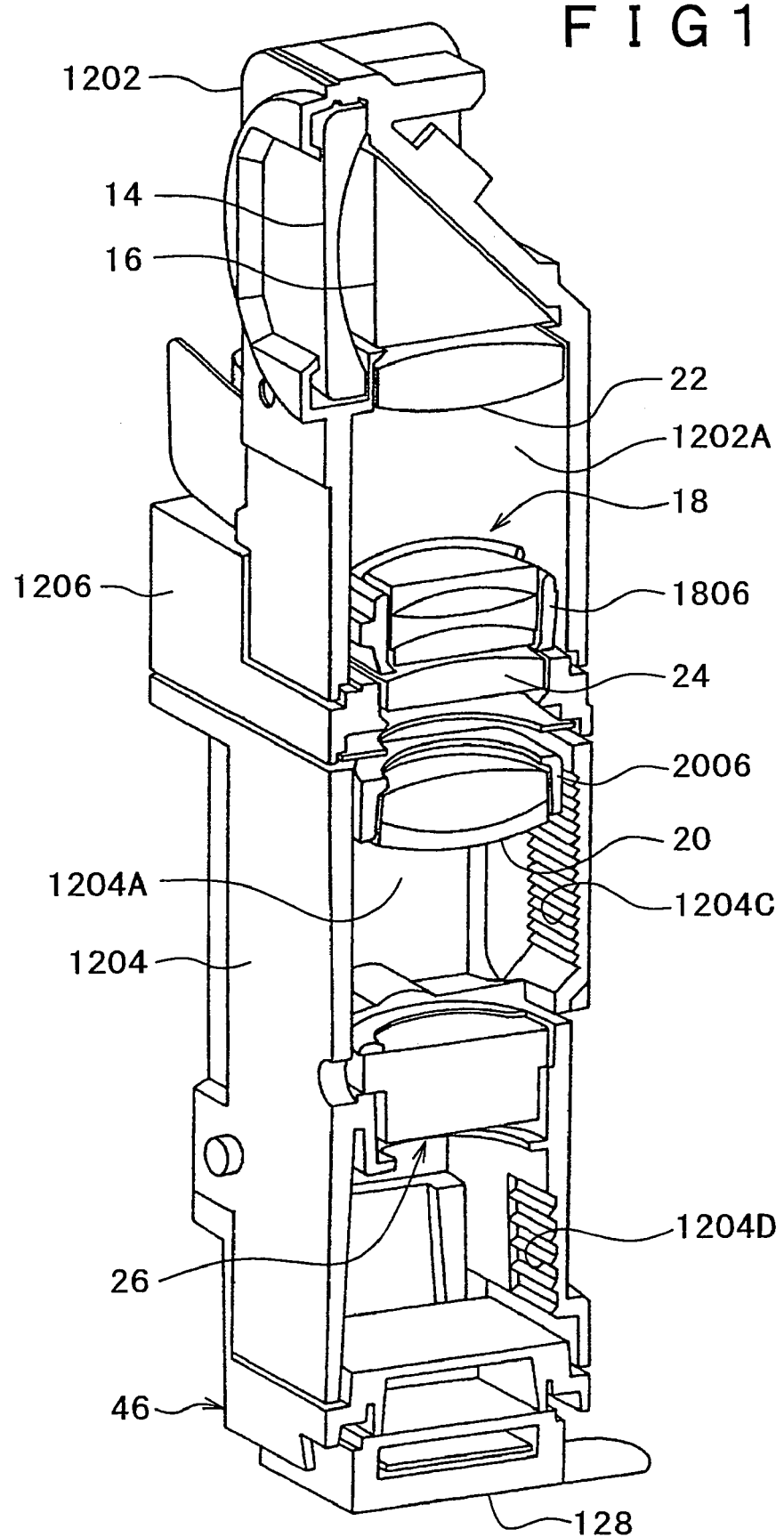
FIG. 12 shows a cross-sectional perspective view of the left-hand section of the lens barrel 10.
Figure 13:
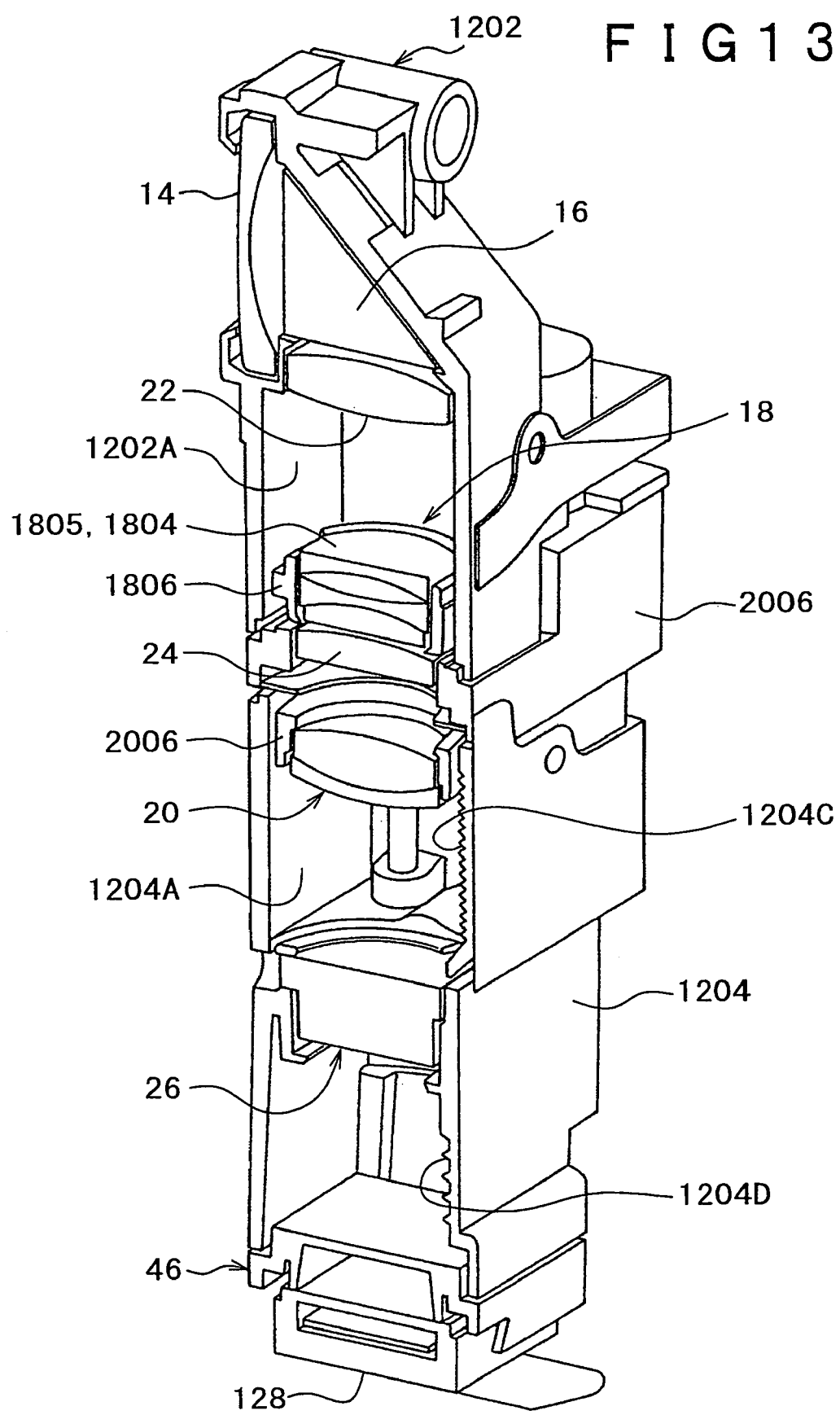
FIG. 13 shows a cross-sectional perspective view of the right-hand section of the lens barrel 10.
Figure 14:
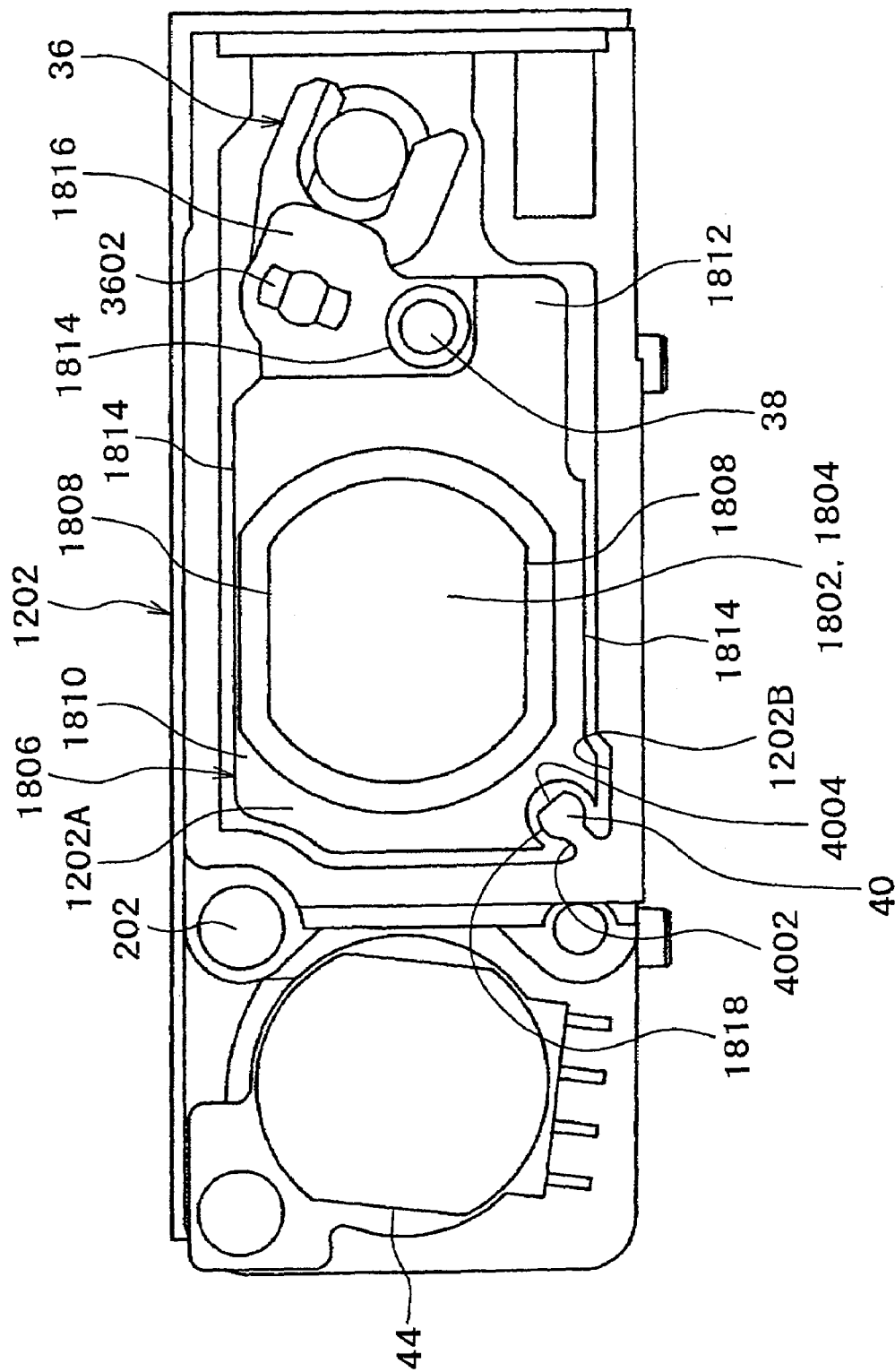
FIG. 14 shows a transversal sectional view of a first divided barrel section 1202.
Figure 15:
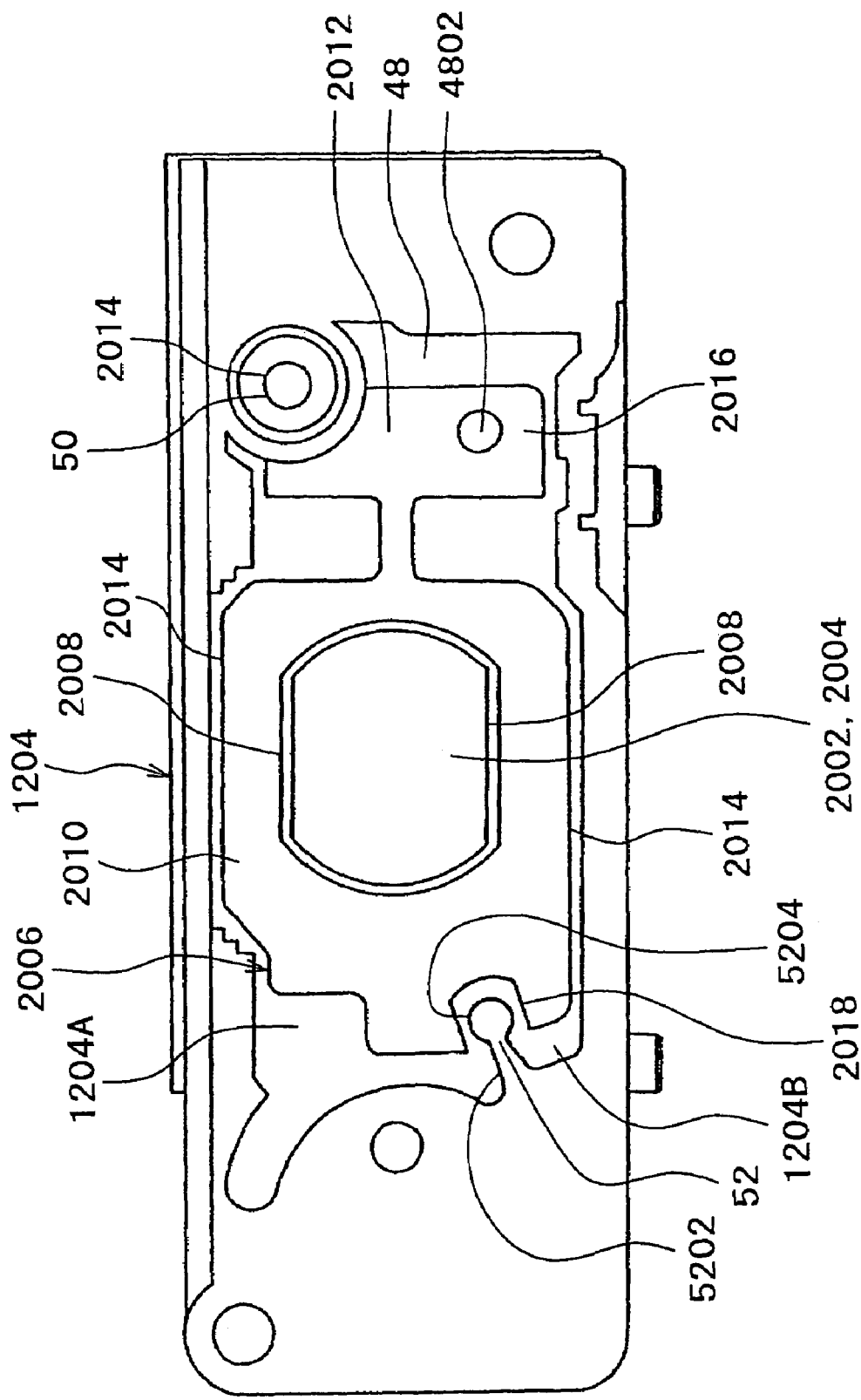
FIG. 15 shows a transversal sectional view of a second divided barrel section 1204.
Figure 16:
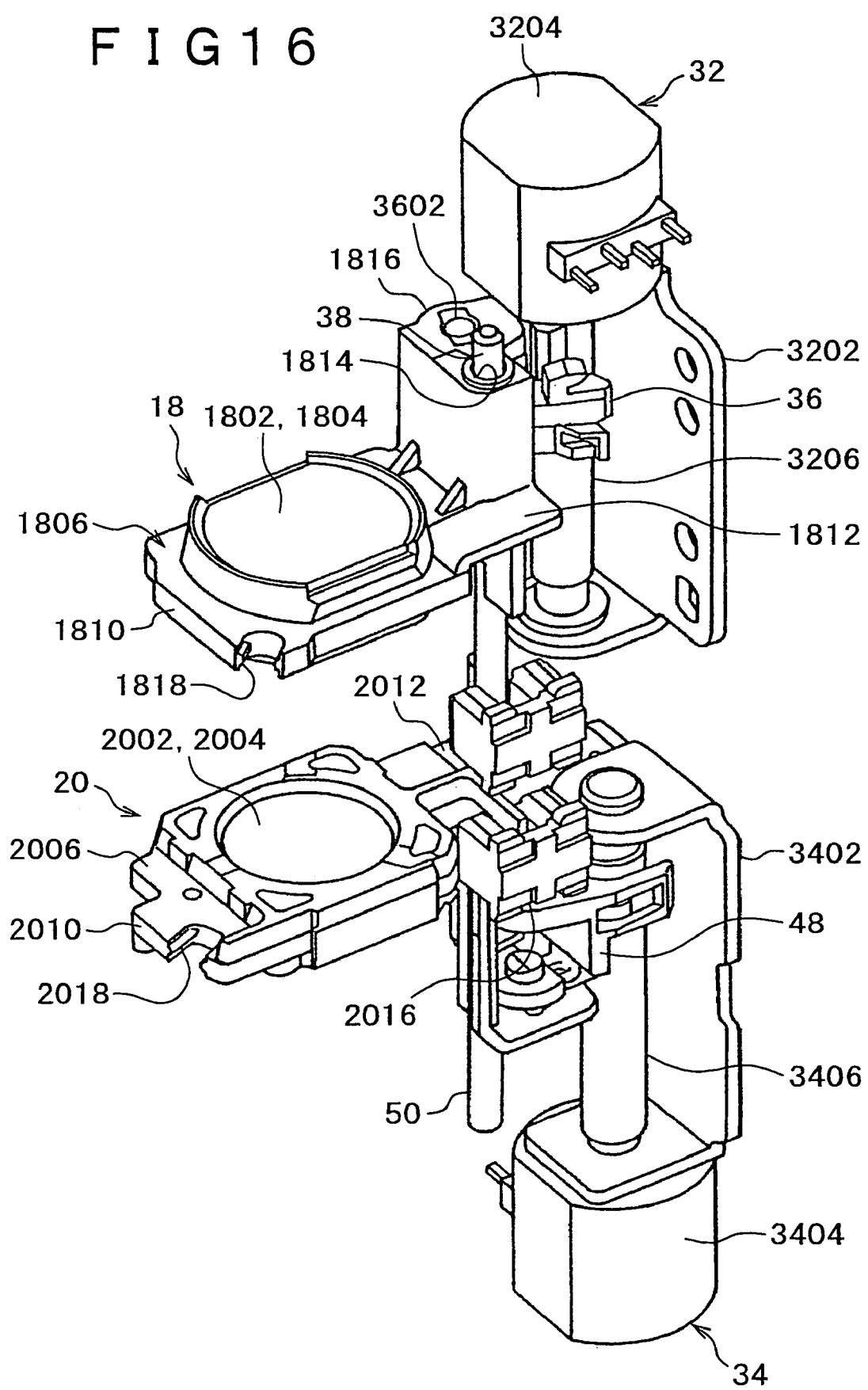
FIG. 16 shows a perspective view of a zooming movable lens group 18 and a focusing movable lens group 20.
Figure 17:
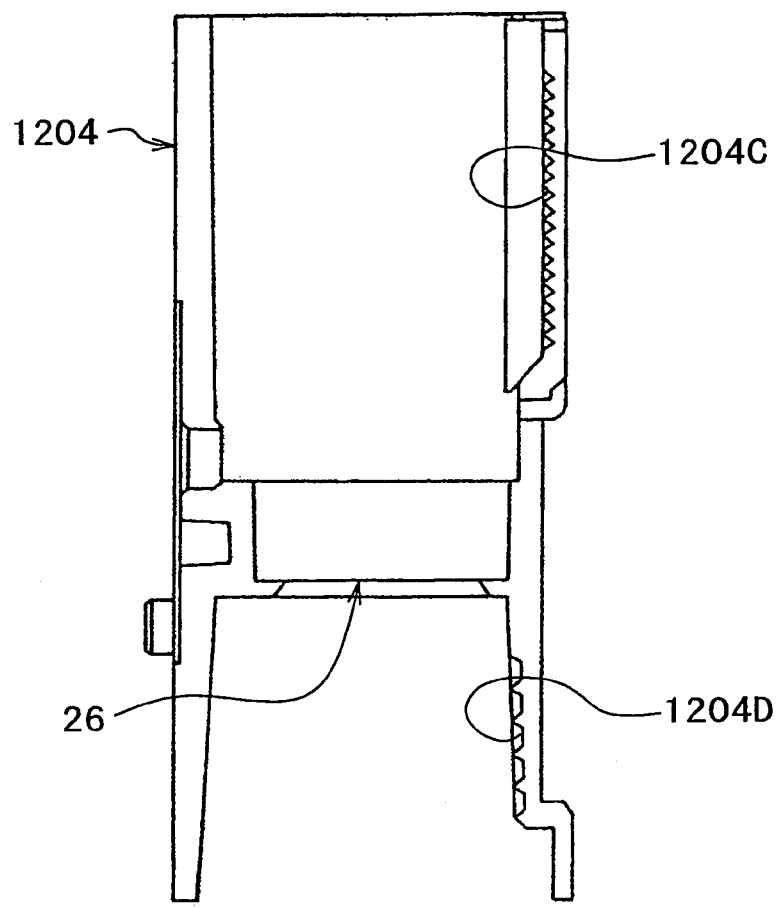
FIG. 17 shows a cross-sectional perspective view of the essential portions of the second divided barrel section 1204.

FIG. 6 is a perspective view of the lens barrel 10 as viewed obliquely from the front side, FIG. 7 is a perspective view of the lens barrel 10 as viewed obliquely from the rear, FIG. 8 is an exploded perspective view showing a partial construction of the lens barrel 10, FIG. 9 is an exploded perspective view showing the remaining construction of the lens barrel 10, FIG. 10 is a cross-sectional view taken along line X—X of FIG. 6, FIG. 11 is a cross-sectional view taken along line Y—Y of FIG. 6, FIG. 12 is a cross-sectional perspective view of the left-hand section of the lens barrel 10, FIG. 13 is a cross-sectional perspective view of the right-hand section of the lens barrel 10, FIG. 14 is a transversal sectional view of a first divided barrel section 1202, FIG. 15 is a transversal sectional view of a second divided barrel section 1204, FIG. 16 is a perspective view of a zooming movable lens group 18 and a focusing, movable lens group 20, and FIG. 17 is a cross-sectional perspective view of the essential portions of the second divided barrel section 1204.

As shown in FIGS. 6 to 9, the lens barrel 10 is constructed to include a barrel 12, the objective lens 14, the imaging element 128 and the optical system 104.

In the present example of the preferred embodiment of the invention, the optical system 104 includes a prism 16, the zooming, movable lens group 18, the focusing, movable lens group 20, a first fixed lens group 22, a second fixed lens group 24, a third fixed lens group 26, a guide mechanism 28 for the zooming movable lens group 18, and a guide mechanism 30 for the focusing movable lens group 20.

The lens barrel 10 further has driving means 32 for moving the zooming, movable lens group 18 and driving means 34 for moving the focusing movable lens group 20.

As shown in FIGS. 6 and 7, the barrel 12 has a flat plate-like shape having a width, a length and a thickness, as a whole, and the objective lens 14, the imaging element 128 and the optical system 104 are arranged along the lengthwise direction of the barrel 12 in the widthwise center thereof. The barrel 12 is made of the first divided barrel section 1202 and the second divided barrel section 1204, which are divided from each other in the lengthwise direction, as well as a third divided barrel section 1206 interposed between these two first divided barrel sections 1202 and 1204. The first divided barrel section 1202 is positioned in one lengthwise half section of the barrel 12, while the second divided barrel section 1204 is positioned in the other lengthwise half section of the barrel 12, and the third divided barrel section 1208 is interposed between these first divided barrel section 1202 and second divided barrel section 1204.

In the present example of the preferred embodiment, since the lengthwise direction of the barrel 12 is arranged in the heightwise direction from the top to the bottom as shown in FIG. 1, the first divided barrel section 1202 is positioned in the top section of the barrel 12, while the second divided barrel section 1204 is positioned in the bottom section of the barrel 12, and the third divided barrel section 1208 is positioned in the heightwise central section of the barrel 12. One thicknesswise face of the barrel 12 which is parallel with the front face of the case 102 of the imaging apparatus 100 constitutes the front face of the barrel 12, the other thicknesswise face of the barrel 12 constitutes the rear face of the barrel 12, one widthwise face of the barrel 12 constitutes the left face of the barrel 12, and the other widthwise face of the barrel 12 constitutes the right face of the barrel 12. In the present example of the preferred embodiment, the first, second and third divided barrel sections 1202, 1204 and 1206 are formed of a synthetic resin material.

As shown in FIGS. 8, 10 and 13, a component housing compartment 1202A which has a rectangular cross section and an open face is provided in an inner side of the first divided barrel section 1202, and the objective lens 14 is mounted in the front top section of the widthwise central section of the first divided barrel section 1202 with a lens holding member 1402 positioned on the front side of the objective lens 14 and a shading frame 1404 positioned on the rear side of the objective lens 14.

A prism member 16 serves to reflect an image captured by the objective lens 14 toward the bottom section (toward the imaging element 128), and in the present example of preferred embodiment, a prism is used as the prism member 16. The prism member 16 is disposed at a location which faces the objective lens 14 in the component housing compartment 1202A.

The first fixed lens group 22 and the zooming, movable lens group 18 are disposed below the prism member 16 in the component housing compartment 1202A.

The first fixed lens group 22 is made of a lens 2202 incorporated in a mounting section of the first divided barrel section 1202 and a holding member 2204 (serving also as a shading frame) which fixes the lens 2202 to the mounting section.

As shown in FIG. 8, the zooming movable lens group 18 has a first zooming lens 1802, second and third zooming lenses 1804 and 1805 which are cemented to each other, and a zooming lens frame 1806 which supports the peripheries of the first, second and third zooming lenses 1802, 1804 and 1805 by caulking.

As shown in FIG. 14, the portions of each of the first, second and third zooming lenses 1802, 1804 and 1805 that are respectively positioned at the thicknesswise opposite ends of the barrel 12 are cut out, whereby edge sections 1808 which respectively extend rectilinearly in parallel with the front and rear faces of the barrel 12 are formed at the opposite ends of the first, second and third zooming lenses 1802, 1804 and 1805 which are respectively positioned at the thicknesswise opposite ends of the barrel 12.

The zooming lens frame 1806 has a holding section 1810 that is positioned around the first, second and third zooming lenses 1802, 1804 and 1805 and holds these first, second and third zooming lenses 1802, 1804 and 1805 and an extending section 1812 which extends from the holding section 1810 in a widthwise direction within the component housing compartment 1202A.

The holding section 1810 has linear sections 1814 which respectively correspond to the edge sections 1808 of the first, second and third zooming lenses 1802, 1804 and 1805 and extend in parallel with the front and rear faces of the barrel 12.

As shown in FIG. 16, the extending section 1812 is provided with a rod insertion hole 1814 and flanges 1816 and 1816 which are opposed to each other in the lengthwise direction of the barrel 12. As shown in FIG. 8, an internally threaded member 36 having an internal thread 3604 is joined to these flanges 1816 and 1816 via shafts 3602 and 3602 in the state of being unmovable in the lengthwise direction of the barrel 12.

An engagement groove 1818 is formed in a portion of the holding section 1810 that is positioned on the opposite side of the extending section 1812 and that is positioned in a corner 1202B of the component housing compartment 1202A (in the present example of the preferred embodiment, at a location where the left and rear faces of the component housing compartment 1202A intersect with each other).

A metal-made main guide shaft 38 which extends in the lengthwise direction of the first divided barrel section 1202 is slidably inserted through the rod insertion hole 1814. The lengthwise opposite ends of the main guide shaft 38 are respectively supported by a wall section which constitutes the top face of the first divided barrel section 1202 and a wall section of the third divided barrel section 1206. The main guide shaft 38 extends in parallel with the optical axis of the first, second and third zooming lenses 1802, 1804 and 1805, and in the present example of the preferred embodiment, extends in the lengthwise direction of the first divided barrel section 1202. Accordingly, the main guide shaft 38 guides the zooming, movable lens group 18 in the optical-axis direction of the zooming movable lens group 18.

A sub-guide axis 40 which extends in the lengthwise direction of the first divided barrel section 1202 is slidably inserted through the engagement groove 1818. Accordingly, the sub-guide axis 40 inhibits the zooming movable lens group 18 from rotating about the main guide shaft 38. The sub-guide axis 40 is formed integrally with the first divided barrel section 1202 and is therefore made of a synthetic resin. Specifically, the sub-guide axis 40 is made of a leg section 4002 which projects from the corner 1202B of the component housing compartment 1202A and a shaft-shaped section 4004 provided at the extending end of this leg section 4002. The sub-guide axis 40 extends in parallel with the optical axis of the first, second and third zooming lenses 1802, 1804 and 1805, and in the present example of preferred embodiment, extends in the lengthwise direction of the first divided barrel section 1202.

The guide mechanism 28 for the zooming movable lens group 18 is made of the main guide shaft 38 and the sub-guide axis 40.

As shown in FIGS. 8 and 16, the driving means 32 has a holder 3202 extending in the lengthwise direction of the barrel 12, a motor 3204 provided on the top of the holder 3202, and an externally threaded member 3206 which extends along the holder 3202 and is rotationally driven by the motor 3204.

The holder 3202 is mounted to a void portion on the right face of the first divided barrel section 1202 so that the externally threaded member 3206 is positioned in the component housing compartment 1202A and the motor 3204 is positioned on the top face of the first divided barrel section 1202.

The externally threaded member 3206 is arranged to mesh with the internal thread 3604 of the internally threaded member 36, whereby the zooming, movable lens group 18 is made to move reciprocally along the optical-axis direction of each of the main guide shaft 38 and the sub-guide axis 40 by the forward and reverse rotations of the motor 3204 while being guided by the main guide shaft 38 and the sub-guide axis 40, thereby effecting zooming operations.

In the present example of the preferred embodiment, as shown in FIG. 14, the zooming movable lens group 18, the main guide shaft 38 and the externally threaded member 3206 are arranged in the widthwise direction of the first divided barrel section 1202 in an inner side of the first divided barrel section 1202, and the sub-guide axis 40 is disposed in a portion of the zooming lens frame 1806 that is positioned on the opposite side of the main guide shaft 38 and the externally threaded member 3206.

As shown in FIG. 8, the third divided barrel section 1206 has an inside section 1206A which faces the inner side of the component housing compartment 1202A, and an outside section 1206B that is positioned outside the component housing compartment 1202A.

The second fixed lens group 24 is mounted on an inner side section 1206A with its optical axis coinciding with the optical axis of the zooming movable lens group 18, and an iris (diaphragm) 42 is disposed on the rear side of the second fixed lens group 24. This iris 42 is opened and closed by a driving unit 44 mounted on the outside section 1206B of the third divided barrel section 1206.

Figure 18:
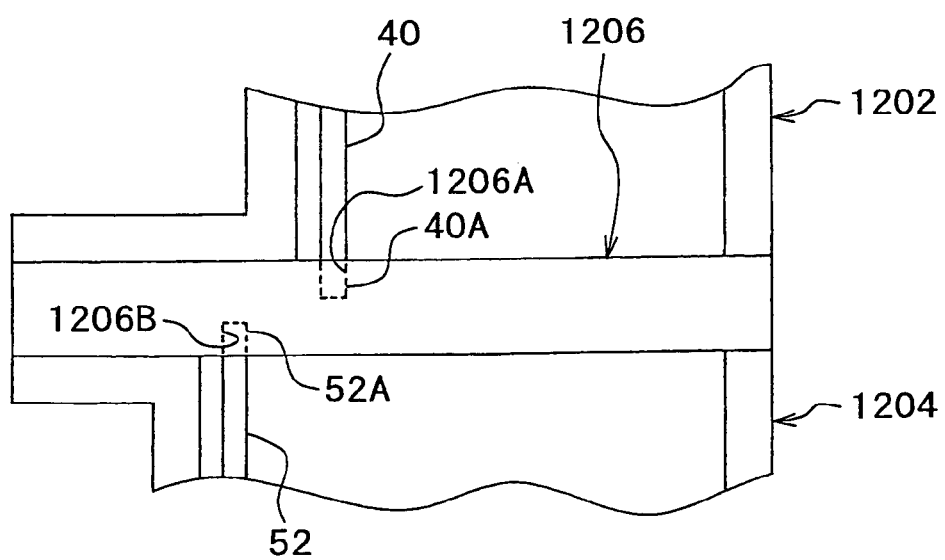
FIG. 18 is an example of a preferred embodiment projected downwardly from the bottom face of the first divided barrel.

In the present example of the preferred embodiment, as shown in FIG. 18, the sub-guide axis 40 is projected downwardly from the bottom face of the first divided barrel section 1202, more specifically, downwardly from the mating face of the first divided barrel section 1202 which adjoins the third divided barrel section 1206, and a projecting portion 40A of this sub-guide axis 40 is fitted into a hole 1206A formed in the mating face of the third divided barrel section 1206, thereby effecting the positioning of the first divided barrel section 1202 and the third divided barrel section 1206.

The first divided barrel section 1202 and the third divided barrel section 1206, as shown in FIG. 14, are secured to each other by a screw 202 at a location near the driving unit 44, while the second divided barrel section 1204 and the third divided barrel section 1206, as shown in FIG. 9, are secured to each other by a screw 204 at a location near the right face.

In the present example of the preferred embodiment, a component housing compartment 1204A which has an open top and bottom and a rectangular cross section is formed in an inner side of the second divided barrel section 1204, and a holder 46 on which to mount the imaging element 128 is mounted to the bottom section of the second divided barrel section 1204, whereby the bottom end of the component housing compartment 1204A is closed. Accordingly, in the present example of the preferred embodiment, the second divided barrel section 1204 is constructed including the holder 46.

The focusing, movable lens group 20 and the third fixed lens group 26 are disposed in the component housing compartment 1204A at a widthwise central location of the second divided barrel section 1204.

The focusing, movable lens group 20 has first and second focusing lenses 2002 and 2004 cemented to each other and a focusing lens frame 2006 that supports the first and second focusing lenses 2002 and 2004.

As shown in FIG. 15, the portions of each of the first and second focusing lenses 2002 and 2004 which are respectively positioned at the thicknesswise opposite ends of the barrel 12 are cut out, whereby edge sections 2008 which respectively extend rectilinearly in parallel with the front and rear faces of the barrel 12 are formed at the opposite ends of the first and second focusing lenses 2002 and 2004 which are respectively positioned at the thicknesswise opposite ends of the barrel 12.

The focusing lens frame 2006 has a holding section 2010 that is positioned around the first and second focusing lenses 2002 and 2004 and holds these first and second focusing lenses 2002 and 2004 and an extending section 2012 which extends from the holding section 2010 in a widthwise direction within the component housing compartment 1204A.

The holding section 2010 has linear sections 2014 which respectively correspond to the edge sections 2008 of the first and second focusing lenses 2002 and 2004 and extend in parallel with the front and rear faces of the barrel 12.

The extending section 2012 is provided with a rod insertion hole 2014 and, as shown in FIG. 16, flanges 2016 and 2016, which are opposed to each other in the lengthwise direction of the barrel 12. As shown in FIG. 9, an internally threaded member 48 having an internal thread 4804 is joined to these flanges 2016 and 2016 via shafts 4802 and 4802 in the state of being unmovable in the lengthwise direction of the barrel 12.

An engagement groove 2018 is formed in a portion of the holding section 2010 that is positioned on the opposite side of the extending section 2012 and that is positioned in a corner 1402B of the component housing compartment 1204A (in the present example of the preferred embodiment, at a location where the left and rear faces of the component housing compartment 1204A intersect with each other).

A metal-made main guide shaft 50 which extends in the lengthwise direction of the second divided barrel section 1204 is inserted slidably through the rod insertion hole 2014. The lengthwise opposite ends of the main guide shaft 50 are respectively supported by a wall section of the third divided barrel section 1206 and a wall section that is provided at the bottom section of the second divided barrel section 1204. The main guide shaft 50 extends in parallel with the optical axis of the first and second focusing lenses 2002 and 2004, and in the present example of preferred embodiment, extends in the lengthwise direction of the second divided barrel section 1204. Accordingly, the main guide shaft 50 guides the zooming, movable lens group 20 in the optical-axis direction of the zooming, movable lens group 28.

A sub-guide axis 52, which extends in the lengthwise direction of the second divided barrel section 1204 is inserted slidably through the engagement groove 2018. Accordingly, the sub-guide axis 52 inhibits the zooming, movable lens group 20 from rotating about the main guide shaft 50. The sub-guide axis 52 is formed integrally with the second divided barrel section 1204 and is therefore made of a synthetic resin. Specifically, the sub-guide axis 50 is made of a leg section 5202 which projects from the corner of the component housing compartment 1204A and a shaft-shaped section 5204 provided at the extending end of this leg section 5202. The sub-guide axis 52 extends in parallel with the optical axis of the first and second focusing lenses 2002 and 2004, and in the present example of preferred embodiment, extends in the lengthwise direction of the first divided barrel section 1204.

The guide mechanism 30 for the zooming movable lens group 20 is made of the main guide shaft 38 and the sub-guide axis 40.

In the present example of preferred embodiment, as shown in FIG. 18, the sub-guide axis 52 is projected upwardly from the top face of the second divided barrel section 1204, more specifically, upwardly from the mating face of the second divided barrel section 1204 which adjoins the third divided barrel section 1206, and a projecting portion 52A of this sub-guide axis 52 is fitted into a hole 1206B formed in the mating face of the third divided barrel section 1206, thereby effecting the positioning of the second divided barrel section 1204 and the third divided barrel section 1206.

The driving means 34 for moving the focusing, movable lens group 20 has a holder 3402 extending in the lengthwise direction of the barrel 12, a motor 3404 provided at the bottom section of the holder 3402, and an externally threaded member 3406 which extends along the holder 3402 and is rotationally driven by the motor 3404.

The holder 3402 is mounted to a void portion on the right face of the second divided barrel section 1204 so that the externally threaded member 3406 is positioned in the component housing compartment 1202A and the motor 3404 is positioned at the bottom section of the second divided barrel section 1204.

The externally threaded member 3406 is arranged to mesh with the internal thread 4804 of the internally threaded member 48, whereby the focusing, movable lens group 20 is made to move reciprocally along the optical-axis direction of each of the main guide shaft 50 and the sub-guide axis 52 by the forward and reverse rotations of the motor 3404 while being guided by the main guide shaft 50 and the sub-guide axis 52, thereby effecting focusing operations.

Accordingly, in the present example of the preferred embodiment, the focusing, movable lens group 20, the main guide shaft 50 and the externally threaded member 3406 are arranged in the widthwise direction of the second divided barrel section 1204 in an inner side of the second divided barrel section 1204, and the sub-guide axis 52 is disposed in a portion of the focusing lens frame 2006 that is positioned on the opposite side of the main guide shaft 50 and the externally threaded member 3406.

The third fixed lens group 26 is made of a third fixed lens group 2602 that is disposed in the component housing compartment 1204A at a location below the focusing, movable lens group 20 and is incorporated in a mounting section of the second divided barrel section 1204 and a holding member 2604 which fixes the third fixed lens group 2602 to the mounting section.

As shown in FIGS. 11, 12, 13 and 17, a toothed section 1204C is provided on a rear portion of the second divided barrel section 1204 which faces the component housing compartment 1204A, at a location between the top end of the component housing compartment 1204A and the second fixed lens group 24.

In addition, a toothed section 1204D is provided on a rear portion of the second divided barrel section 1204 which faces the component housing compartment 1204A, at a location between the third fixed lens group 26 and the imaging element 128.

These toothed sections 1204C and 1204D are provided for preventing the fact that light, which has propagated via the objective lens 14, the prism member 16, the first fixed lens group 22, the zooming, movable lens group 18, the second fixed lens group 24 and the focusing, movable lens group 20, reaches the rear portion of the second divided barrel section 1204 which faces the component housing compartment 1204A and is reflected at the rear portion to produce reflected light called a flare or a ghost, and this reflected light reaches the light receiving surface of the imaging element 128 and adversely affects the captured image signals of the imaging element 128.

It is to be noted that the pitch of the teeth of the toothed section 1204C provided at a location distant from the imaging element 128 is formed to be larger than the pitch of the teeth of the toothed section 1204D provided at a location close to the imaging element 128. This is because the angle of the light falling on the toothed section 1204D is smaller than the angle of the light falling on the toothed section 1204C, and this construction in which the pitch of the teeth of the toothed section 1204C is made different from the pitch of the teeth of the toothed section 1204D provides the advantage of improving the removability of the second divided barrel section 1204 from a mold during its molding.

A mounting structure for the imaging element 128 will be described below.

Figure 19:
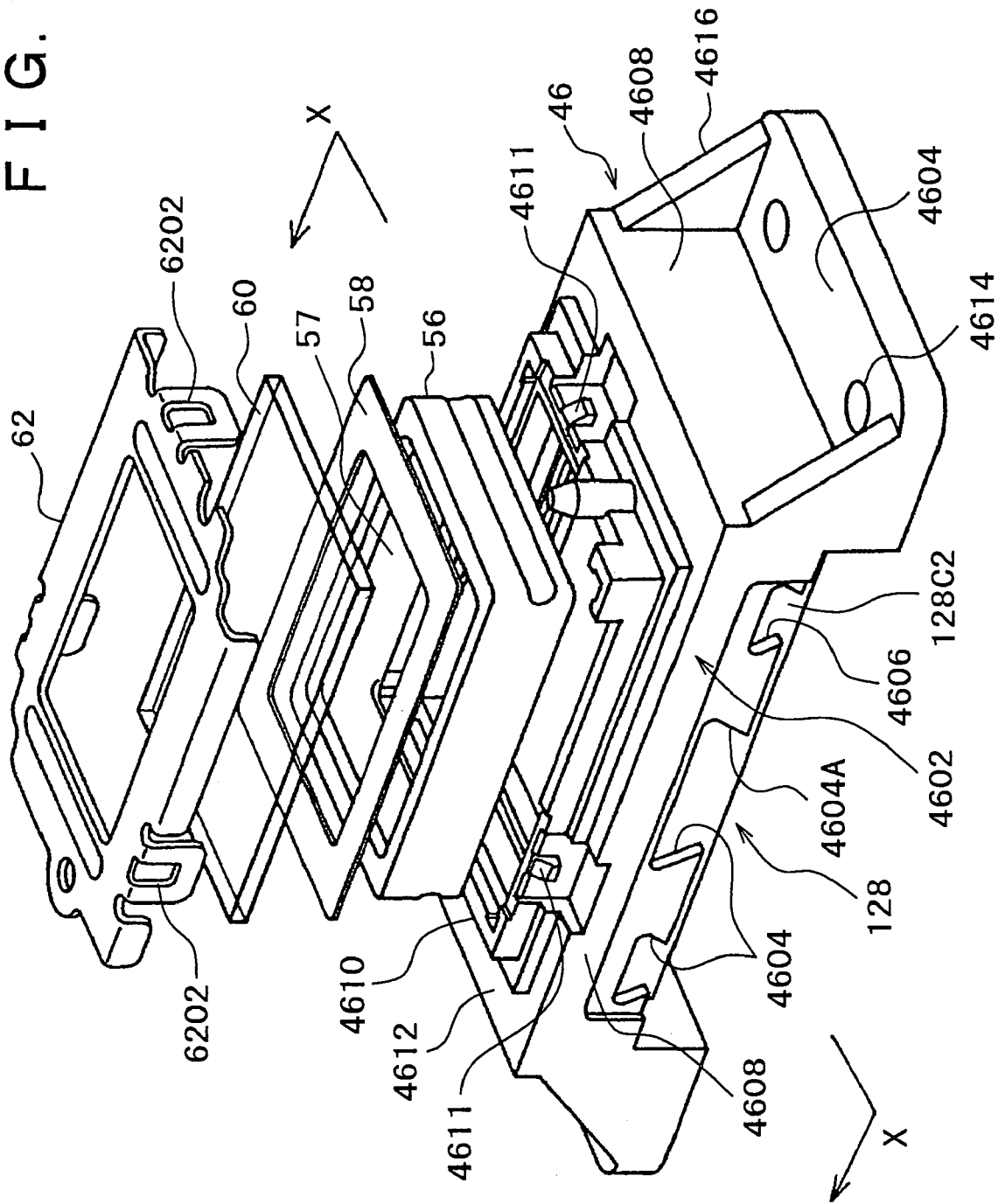
FIG. 19 shows an exploded perspective view showing a mounting structure for the imaging element 128.
Figure 20:
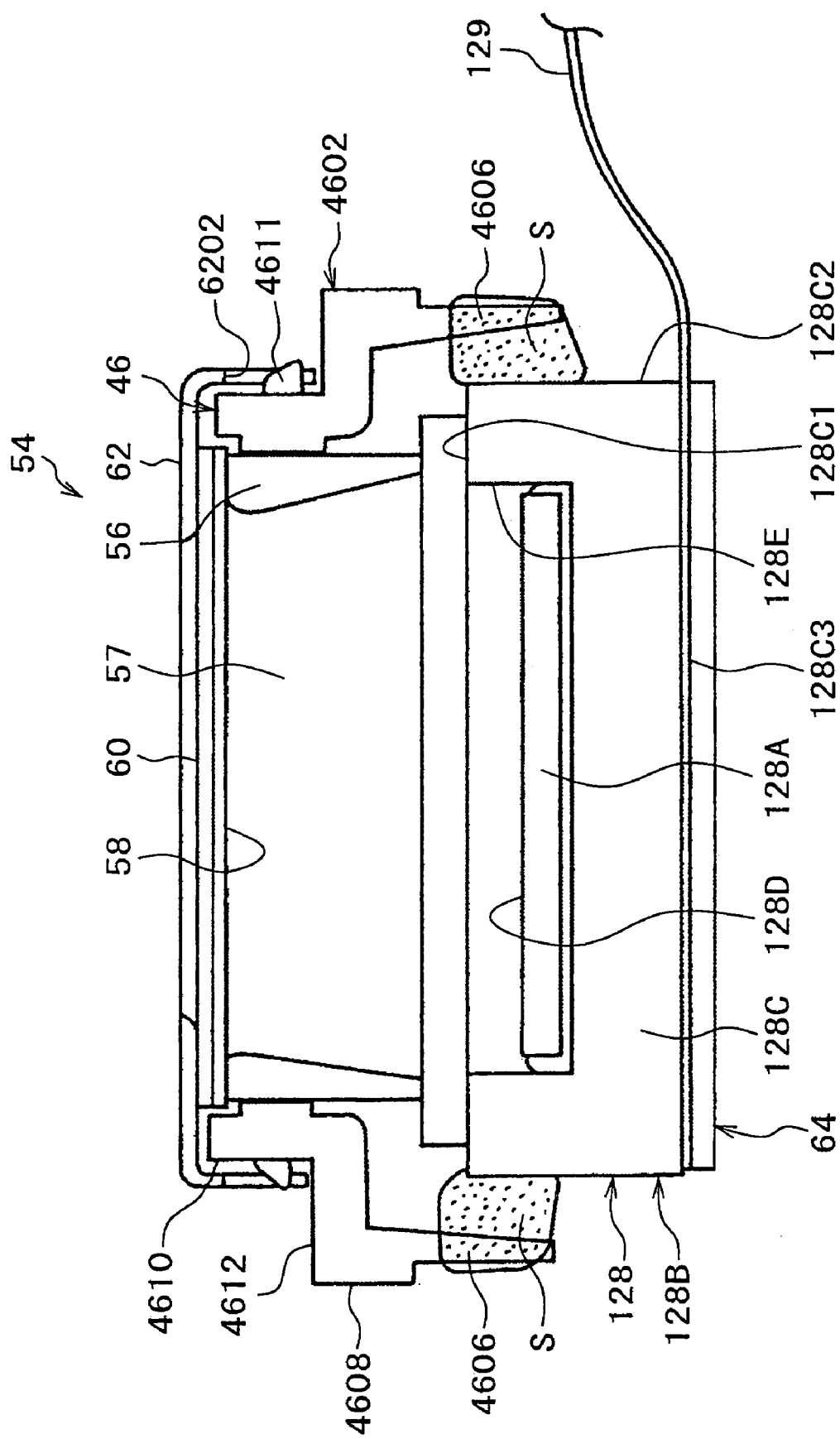
FIG. 20 shows a cross-sectional view taken along line X—X of FIG. 19.
Figure 21:
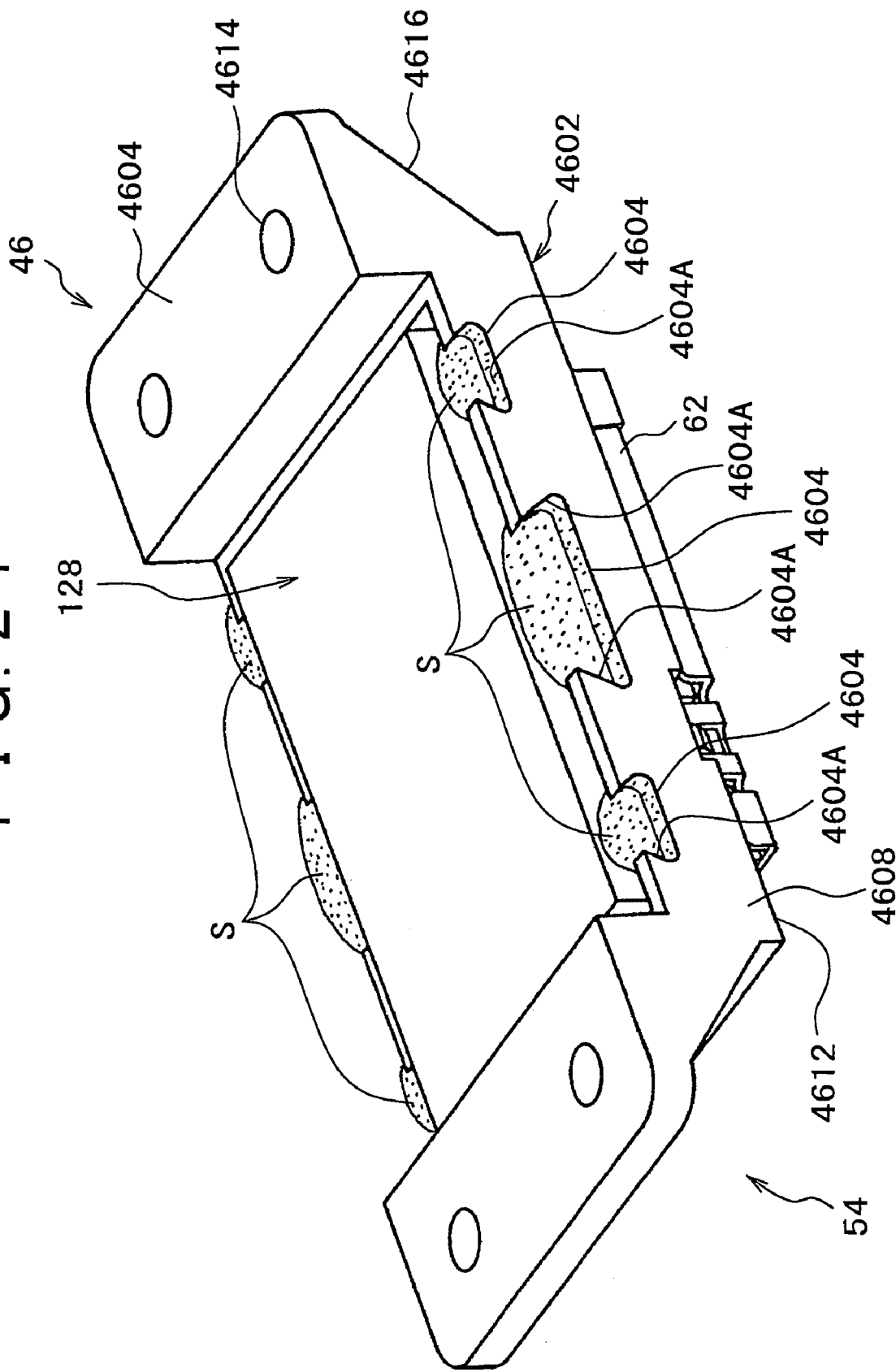
FIG. 21 shows a perspective view of the state in which the imaging element is mounted on the holder 46, as viewed obliquely from below.

FIG. 19 is an exploded perspective view showing a mounting structure for the imaging element 128, FIG. 20 is a cross-sectional view taken along line X—X of FIG. 19, and FIG. 21 is a perspective view of the state in which the imaging element is mounted on the holder 46, as viewed obliquely from below.

As shown in FIG. 10, an imaging-element mounting section 1205 in which the imaging element 128 is to be arranged is provided in the bottom section of the barrel 12.

The imaging-element mounting section 1205 has an opening 1204B, which allows the imaging element 128 to face the component housing compartment 1204A, and a mounting seat 1204C that is provided at the periphery of the opening 1204B.

In the present example of the preferred embodiment, an imaging unit 54 is constructed so that the imaging element 128 is held by the holder 46, and this imaging unit 54 is mounted on the imaging-element mounting section 1205 so that the imaging element 128 is arranged in the barrel 12.

As shown in FIG. 20, the imaging element 128 is constructed to include an imaging unit 128A and a package 128B in which this imaging unit 128A is housed.

The package 128B has a rectangular shape which has a width and a length larger than the width, for example, a considerably small width of approximately 5 to 10 mm and a considerably small length of approximately 10 to 20 mm.

The package 128B is provided with a case 1028C and a seal glass 128D.

The case 1028C has a top face 128C1, four side faces 128C2 and a bottom face 128C3, and a hollow portion 128E is formed in the top face 128C1 and the imaging unit 128A is mounted on the bottom face of the hollow portion 128E with the light receiving surface facing up. The imaging unit 128A is made of, for example, a CCD or CMOS sensor. The seal glass 128D is mounted to the top face 128C1 of the case 1028C to cover the hollow portion 128E.

A flexible printed circuit board 129, which serves as a wiring member for enabling communication of the above-mentioned driving signals and imaging signals between the imaging unit 128A and the above-mentioned image processing unit 130, is mounted to the bottom face 128C3 of the case 1028C, and a metal plate 64 is secured to the back surface of the flexible printed circuit board 129. The imaging element 128, the flexible printed circuit board 129 and the metal plate 64 will be described later As shown in FIG. 19, the holder 46 has a frame section 4602 which surrounds the periphery of the package 128B, mounting plate sections 4604 which project from the frame section 4602 and are mounted to the mounting seat 1204C with the imaging unit 128A facing the optical path of the above-mentioned optical system, and adhesive-filling void portions 4606 provided in the frame section 4602.

The frame section 4602 is formed in a rectangular shape corresponding to the shape of the package 128B and having two pairs of sides opposed to each other. The two pairs of sides each have a lower wall 4608 which faces the corresponding one of the side surfaces of the package 128B on the outside thereof and an upper wall 4610 which is connected to the top of the lower wall 4608 and extends upwardly of the top face of the package 128B.

A top face 4612, which faces up and has a rectangular shape is formed in a portion of the upper wall 4610 which is close to the lower wall 4608.

The mounting plate sections 4604 are projected respectively from one of the above-mentioned two pairs of sides, screw inserting holes 4614 are formed in each of the mounting plate sections 4604, and the opposite sides of each of the mounting plate sections 4604 and the corresponding one of the lower walls 4608 are joined together by reinforcing ribs 4616.

The adhesive-filling void portions 4606 are provided on each of the lower walls 4608 of the other of the above-mentioned two pairs of sides.

Each of the adhesive-filling void portions 4606 is formed in a laterally long shape which extends in the extending direction of a side surface 128C2 of the package 128B.

In the present example of the preferred embodiment, the adhesive-filling void portions 4606 are formed to be open at the bottom ends of the lower walls 4608, and three adhesive-filling void portions 4606 are arranged so as to be spaced apart from one another in the extending direction of each of the side surfaces 128C2 of the package 128B.

In addition, in the present example of the preferred embodiment, the dimension of each of the adhesive-filling void portions 4606 in the extending direction of the side surface 128C2 of the package 128B is formed to become gradually larger in a direction away from the bottom end of the lower wall 4608. Namely, the space between each pair of edge sections 4604A which are opposed to each other to constitute the corresponding one of the adhesive-filling void portions 4606 is formed to become gradually wider in the direction away from the bottom end of the lower wall 4608, whereby each pair of edge sections 4604A are inclined from each other.

A frame-shaped rubber seal 56 is disposed to extend along the periphery of the top face of the package 128B inside the upper walls 4610 of the above-mentioned two pairs of sides of the frame section 4602, and a space 57 which faces the imaging unit 128A is formed inside the rubber seal 56.

A plate-shaped filter 60 is disposed to close this space 57 with a frame-shaped shading sheet 58 interposed between the filter 60 and the top end of the rubber seal 56. In the present example of preferred embodiment, the filter 60 is made of a low-pass filter.

The filter 60 is disposed to press the top end of the rubber seal 56 via the shading sheet 58 by means of a holding member 62 mounted to the upper walls 4610, and the rubber seal 56 is compressed by the filter 60. The holding member 62 is mounted on the holder 46 by engagement claws 4611 of the upper walls 4610 being respectively brought in engagement with engagement slots 6202 of the holding member 62.

Accordingly, the space 57 is closed by the rubber seal 56, the shading sheet 58, the filter 60 and the like so as to be protected from contamination with dust and the like.

The assembly of the imaging unit 54 using the holder 46 will be described below.

First of all, the imaging element 128 is positioned with respect to the holder 46 by using an assembly jig which is not shown.

Specifically, for example, the imaging element 128 mounted to the flexible printed circuit board 129 and the holder 46 are secured to the assembly jig which is not shown, and the holder 46 is positioned above the top face of the package 128B while placing the lower walls 4608 of the holder 46 in parallel with the four side surfaces 128C2 of the package 128B of the imaging element 128.

In this state, the position of the imaging element 128, i.e., the position of the package 128B, is adjusted with respect to the mounting plate sections 4604 of the holder 46. Specifically, the position of the imaging element 128 is adjusted so that the center of the light receiving surface of the imaging unit 128A coincides with and crosses at right angles the optical axis of the above-mentioned optical system when the imaging unit 54 is mounted to the imaging-element mounting section 1205. This position adjustment can be performed on the basis of image data generated on the basis of captured image signals that are obtained from the imaging element 128 by causing the imaging element 128 to pick up an image of a predetermined test chart (test pattern).

When the above-mentioned position adjustment is completed, the positionally adjusted imaging element 128 and the holder 46 are turned upside down as shown in FIG. 21.

Then, a UV curing type adhesive S is charged into each of the adhesive-filling void portions 4606 of the holder 46 by means of a syringe for adhesive coating.

At this time, since each of the adhesive-filling void portions 4606 is formed to be open at the bottom end of the corresponding one of the lower walls 4608, the charging of the UV curing type adhesive S is easily and reliably performed by turning the imaging element 128 and the holder 46 upside down so that the adhesive-filling void portions 4606 become upwardly open. Thus, the UV curing type adhesive S is held between each of the side surfaces 128C2 of the package 128B and the corresponding ones of the adhesive-filling void portions 4606 and between each of the side surfaces 128C2 and an inner side face of the corresponding one of the lower walls 4608 which surrounds the corresponding ones of the adhesive-filling void portions 4606.

Then, the UV curing type adhesive S charged in the each of the adhesive-filling void portions 4606 is cured by irradiation with ultraviolet rays. At this time, the irradiation of ultraviolet rays onto the charged UV curing type adhesive S is easily and reliably performed because each of the adhesive-filling void portions 4606 is exposed outwardly from the corresponding one of the lower walls 4608 of the holder 46, and because the space between each of the side surfaces 128C2 of the package 128B and the corresponding one of the lower walls 4608 of the holder 46 is upwardly open as shown in FIG. 21.

Accordingly, the imaging element 128 and the holder 46 are adhered to each other in the positioned state.

Then, the rubber seal 56, the shading sheet 57, the filter 60, the filter 60 and the holding member 62 are secured to the holder 46 to which the imaging element 128 has been adhered in this manner.

Namely, as shown in FIG. 19, the frame-shaped rubber seal 56 and the shading sheet 58 are stacked in this order on the periphery of the top face of the package 128B inside the upper walls 4610 of the above-mentioned two pairs of sides of the frame section 4602 of the holder 46, and then the holding member 62 is mounted to the upper walls 4610.

In this manner, the imaging unit 54 is assembled.

The mounting of the imaging unit 54 to the imaging-element mounting section 1205 of the barrel 12 is effected by inserting the upper walls 4610 of the holder 46 into the opening 1204B of the barrel 12, bringing the mounting plate sections 4604 of the imaging unit 54 into abutment with the mounting seat 1204C of the barrel 12, and tightly screwing screws inserted through the respective screw inserting holes 4614 into the corresponding screw holes of the mounting seat 1204C.

The imaging-element mounting section 1205 and the imaging unit 54 are provided with publicly known positioning means, such as a knock pin and a positioning hole into which the known pin is to be inserted, and are constructed to be positioned by inserting the upper walls 4610 of the holder 46 into the opening 1204B of the barrel 12 so as to bring the mounting plate sections 4604 of the imaging unit 54 into abutment with the toothed section 1204C of the barrel 12.

The mounting structure and the assembly of the imaging element 128, the flexible printed circuit board 129 and the metal plate 64 will be described below.

Figure 22:
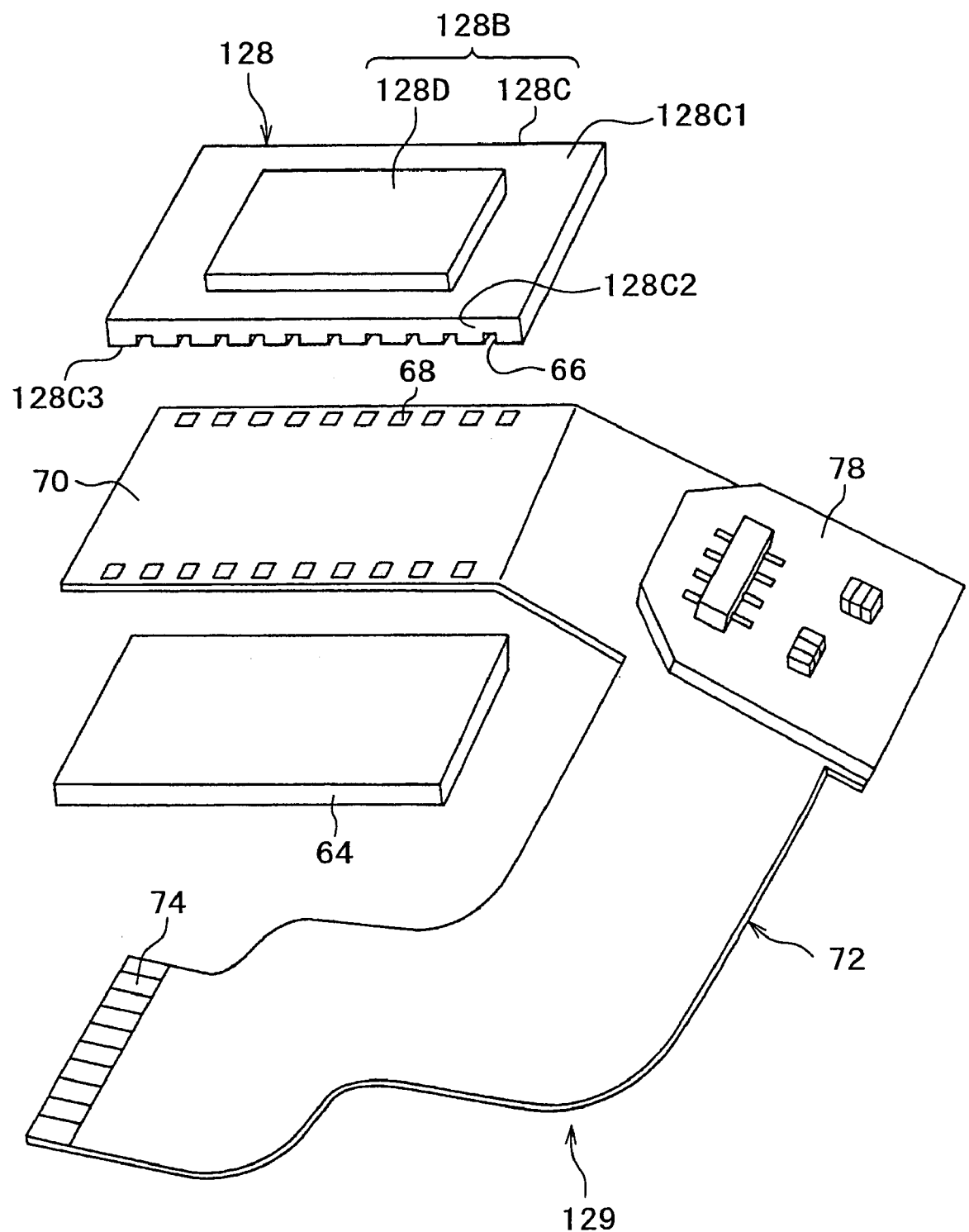
FIG. 22 shows an exploded perspective view of the imaging element 128, the flexible printed circuit board 129 and the metal plate 64.
Figure 23:
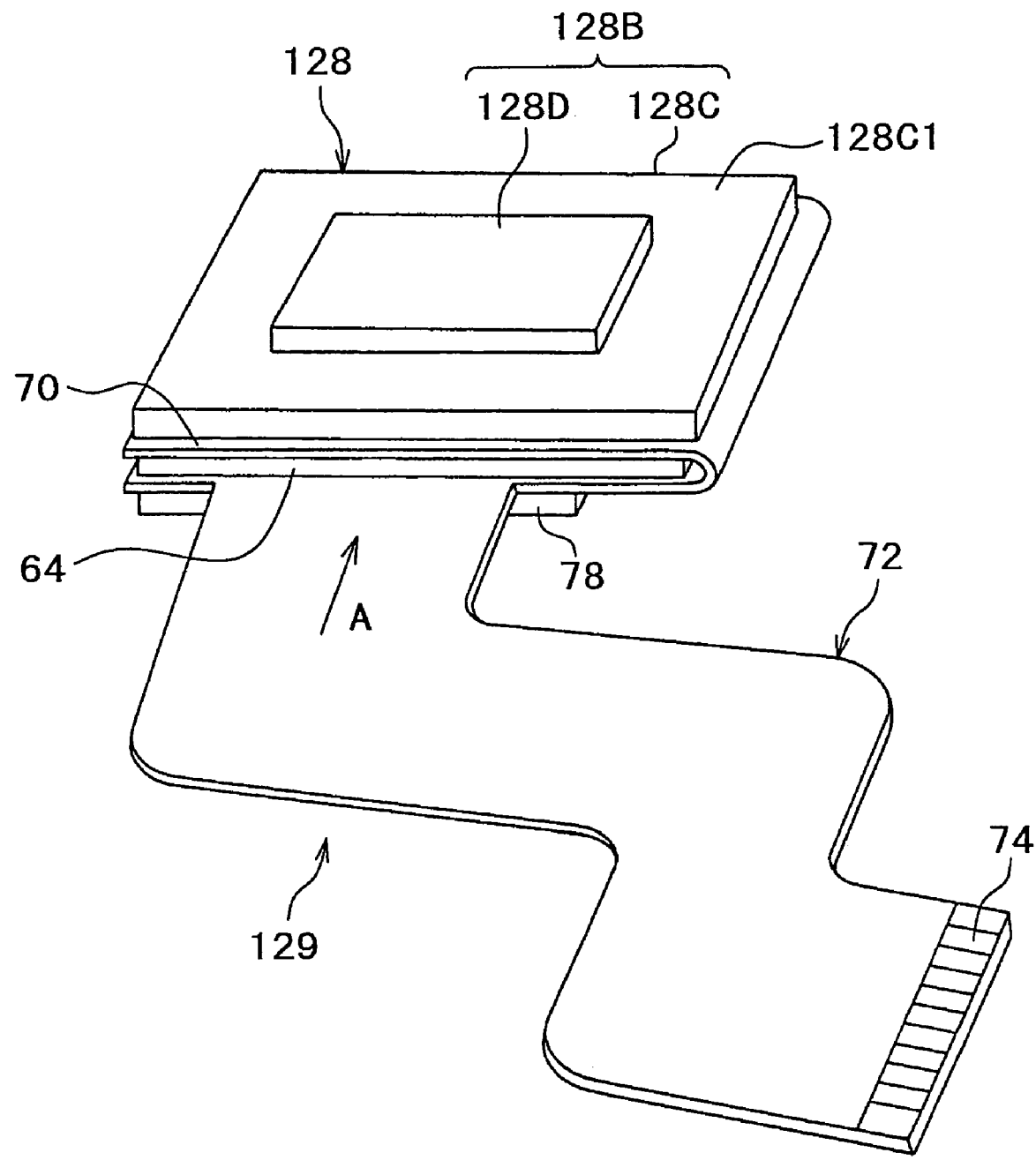
FIG. 23 shows a perspective view of the assembled state of the imaging element 128, the flexible printed circuit board 129 and the metal plate 64.
Figure 24:
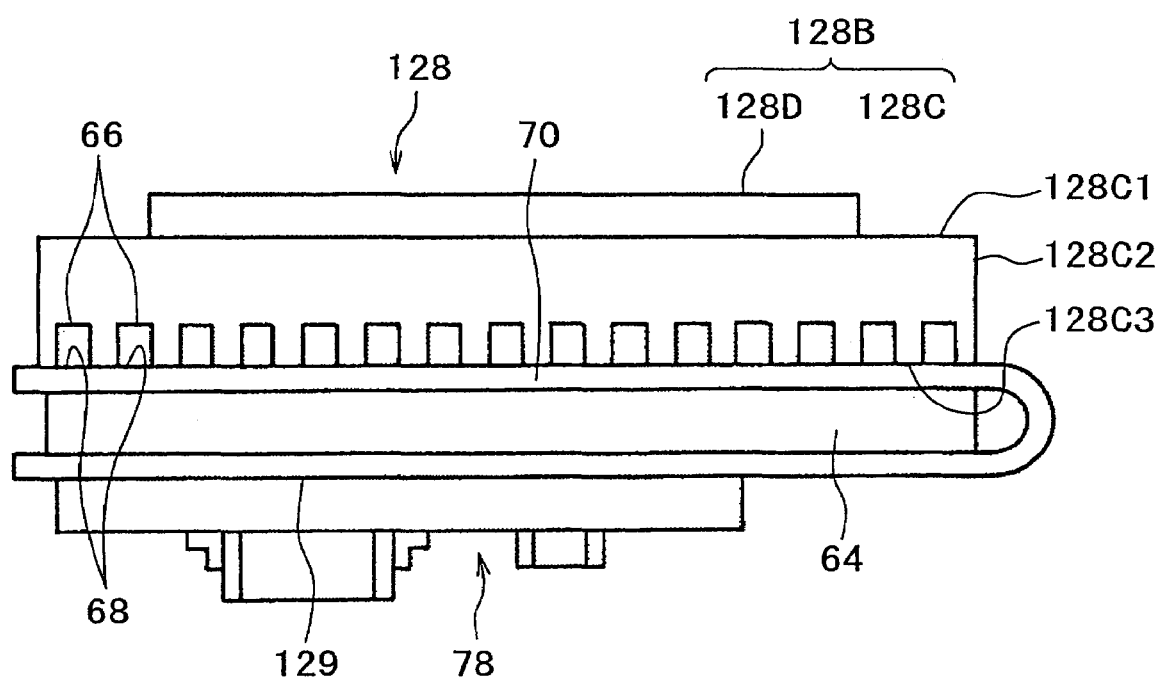
FIG. 24 shows a view taken in the direction of the arrow A of FIG. 23.
Figure 26:
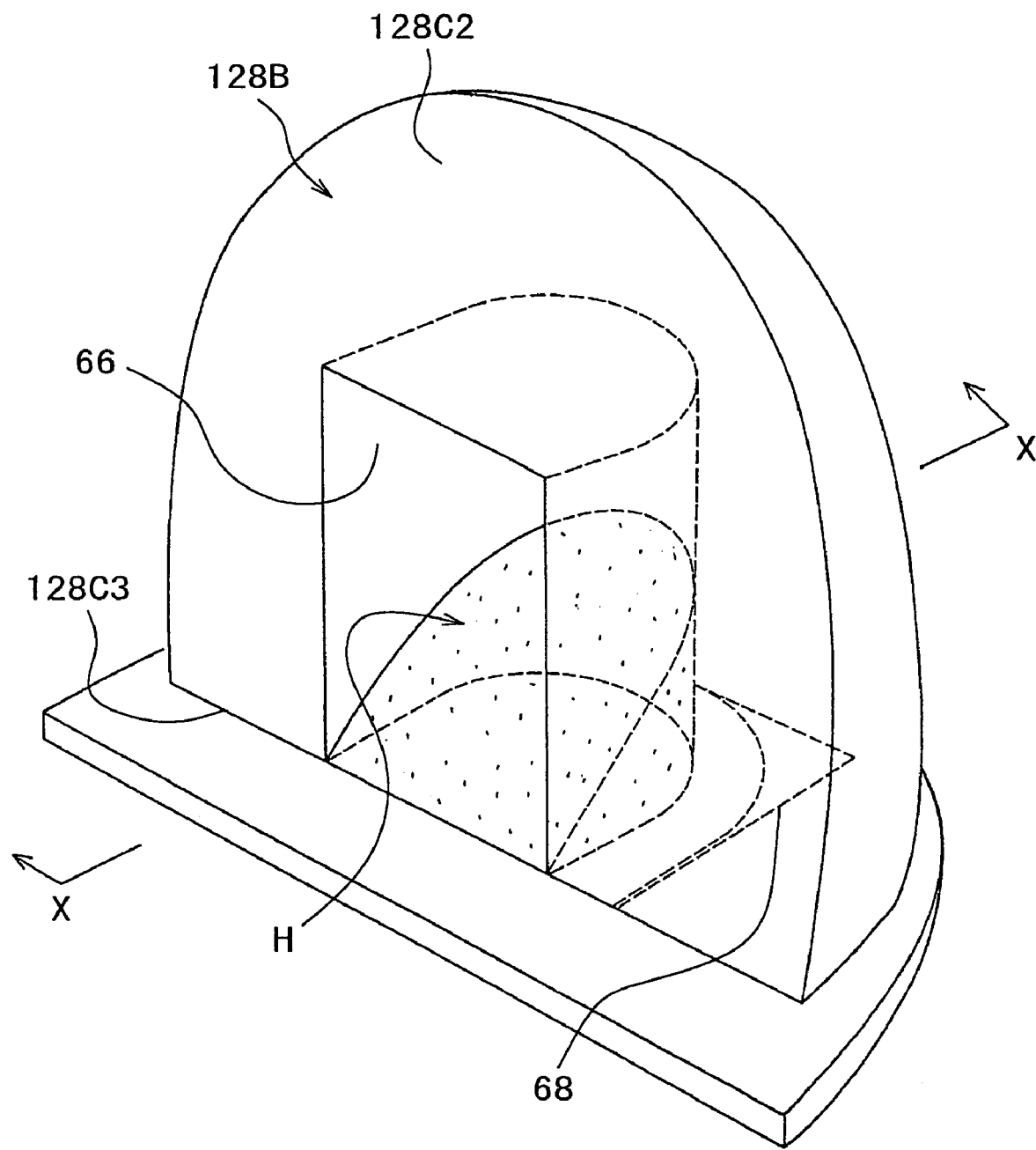
FIG. 26 shows an explanatory view of soldering between the first connecting terminal 66 of the imaging element 128 and the second connecting terminal 68 of the flexible printed circuit board 129.
Figure 27:
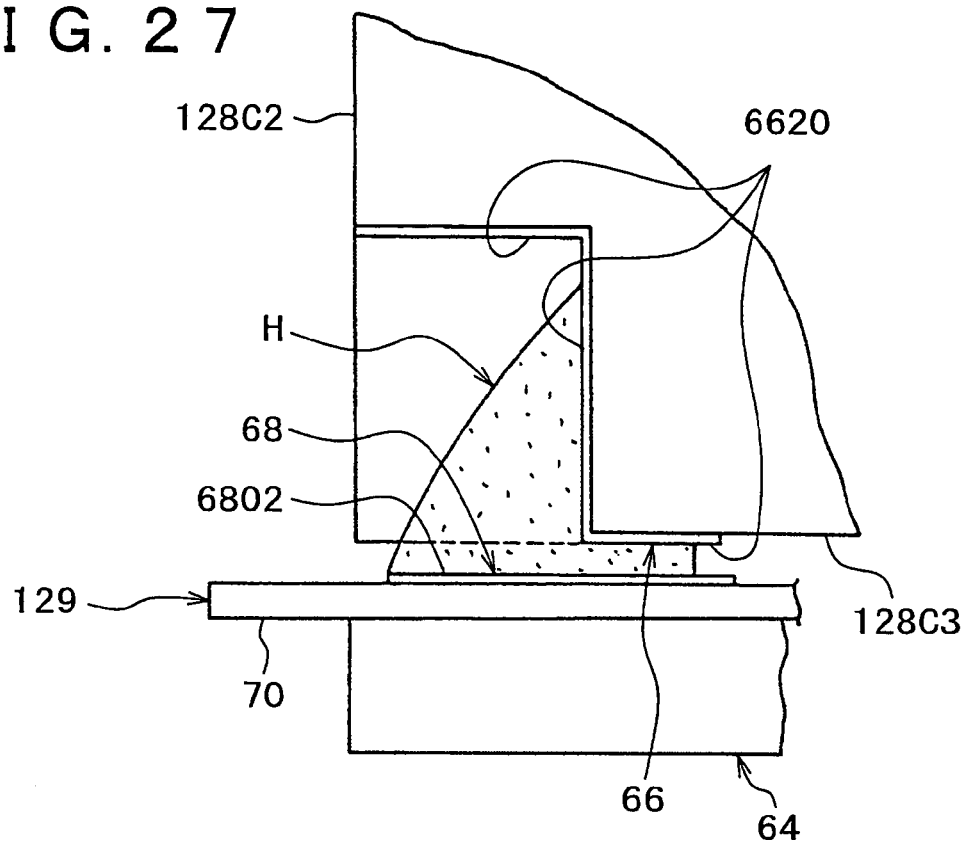
FIG. 27 shows a cross-sectional view taken along line X—X of FIG. 26.

FIG. 22 is an exploded perspective view of the imaging element 128, the flexible printed circuit board 129 and the metal plate 64, FIG. 23 is a perspective view of the assembled state of the imaging element 128, the flexible printed circuit board 129 and the metal plate 64, FIG. 24 is a view taken in the direction of an arrow A, FIG. 25 is an explanatory view of a first connecting terminal 66 of the imaging element 128 and a second connecting terminal 68 of the flexible printed circuit board 129, FIG. 26 is an explanatory view of soldering between the first connecting terminal 66 of the imaging element 128 and the second connecting terminal 68 of the flexible printed circuit board 129, FIG. 27 is a cross-sectional view taken along line X—X of FIG. 26, and FIG. 28 is an explanatory view showing the positional relationship between the imaging element 128, the flexible printed circuit board 129 and the metal plate 64. In FIG. 28, (A) is a plan view and (B) is a view taken in the direction of an arrow B.

As shown in FIG. 22, a plurality of first connecting terminals 66 are provided on the bottom face 128C3 (rear face) of the case 1028C of the package 128B of the imaging element 128.

The first connecting terminals 66 are formed along each of a pair of opposite long sides of the bottom face 128C3 of the case 1028C in the state of being spaced apart from one another in the extending direction of each of the long sides.

More specifically, as shown in FIGS. 25 and 27, a plurality of semi-cylindrical concave sections are formed along each of a pair of opposite long sides of the bottom face 128C3 of the case 1028C in the state of being spaced apart from one another in the extending direction of each of the long sides. Each of these semi-cylindrical concave sections is opened in the bottom face 128C3 of the case 1028C in a semi-circular shape, and in the side surface 128C2 of the case 1028C in a rectangular shape. The first connecting terminal 66 is made of a plating layer 6602 that is provided on the inner surface of this cylindrical concave section and on a portion of the bottom face 128C that is connected to the inner surface.

As shown in FIG. 22, the flexible printed circuit board 129 is constructed to include an imaging-element mounting section 70 on which the imaging element 128 is to be mounted, an extending section 72 extended from the imaging-element mounting section 70, and a connecting section 74 provided at the extending end of the extending section 72 so as to be connected to the image processing unit 130.

The imaging-element mounting section 70 has a part of the flexible printed circuit board 129 and a plurality of second connecting terminals 68 provided on the surface of this part of the flexible printed circuit board 129 so as to correspond to the respective first connecting terminals 66.

In the present example of the preferred embodiment, the width of the part of the flexible printed circuit board 129 which constitutes the imaging-element mounting section 70 and the width of the part of the flexible printed circuit board 129 which constitutes the extending section 72 are each formed to be approximately the same as the width of the package 128B. In the present example of the preferred embodiment, the width of the part of the flexible printed circuit board 129 which constitutes the imaging-element mounting section 70 and the width of the part of the flexible printed circuit board 129 which constitutes the extending section 72 are each formed to be slightly larger than the width of the package 128B.

Each of the second connecting terminals 68 is made of a plating layer 6802 provided on the surface of the part of the flexible printed circuit board 129, as shown in FIG. 25. More specifically, the second connecting terminals 68 are provided on the widthwise opposite sides of the part of the flexible printed circuit board 129 which constitutes the imaging-element mounting section 70, in the state of being spaced part from one another in the lengthwise direction of the imaging-element mounting section 70.

As shown in FIG. 24, the package 128B of the imaging element 128 is mounted to the part of the flexible printed circuit board 129 with the first connecting terminals 66 connected to the respective second connecting terminals 68 by soldering; that is to say, the package 128B is mounted on the imaging-element mounting section 70.

The metal plate 64, as viewed in the thicknesswise direction of the package 128B, has an outline which is approximately the same as the package 128B, or an outline which is made larger than that of the package 128B so that the outline of the package 128B is contained in that of the metal plate 64.

The metal plate 64 is mounted, as by adhesion, on the rear face of the part of the flexible printed circuit board 129 which constitutes the imaging-element mounting section 70, at a position where the outline of the metal plate 64 coincides with the outline of the package 128B or the outline of the package 128B is placed in the outline of the metal plate 64, as viewed in the thicknesswise direction of the package 128B.

In the present example of preferred embodiment, the metal plate 64 is formed to have a rectangular shape with a width of approximately the same dimension as the width of the package 128B and with a length of approximately the same dimension as the length of the package 128B, and the outline of the metal plate 64 and the outline of the package 128B coincide with each other as viewed in the thicknesswise direction of the package 128B.

In addition, the metal plate 64 is formed of a metal material having the nature of retaining its rigidity at the temperature of heating by which each of the first connecting terminals 66 and the corresponding one of the second connecting terminals 68 are being soldered. As this metal material, aluminum and the like can be used.

In addition, in the present example of the preferred embodiment, as shown in FIG. 22, a printed circuit board 78, which communicates signals between the imaging element 128 and the image processing unit 130 and has an electronic circuit and the like for amplifying captured image signals, is mounted on the surface of the part of the flexible printed circuit board 129 which constitutes the extending section 72.

It is to be noted that this electronic circuit also may be constructed by directly mounting components on the flexible printed circuit board 129, instead of using the printed circuit board 78.

As shown in FIGS. 23 and 24, the flexible printed circuit board 129 is folded back along the boundary between the part of the flexible printed circuit board 129 which constitutes the extending section 72 and the part of the flexible printed circuit board 129 which constitutes the imaging-element mounting section 70, and the rear face of the part of the flexible printed circuit board 129 on which the printed circuit board 78 is mounted and the metal plate 64 are superimposed on and secured to each other.

The assembly of the imaging element 128, the flexible printed circuit board 129 and the metal plate 64 is performed in the following manner.

First, before the package 128B is mounted on the imaging-element mounting section 70, the metal plate 64 is mounted to the rear face of the imaging-element mounting section 70.

In this case, the metal plate 64 is mounted so that the second connecting terminals 68 are respectively positioned at locations along the opposite long sides of the metal plate 64 as viewed in the thicknesswise direction of the flexible printed circuit board 129.

Then, the second connecting terminals 68 of the imaging-element mounting section 70 are coated with a solder paste, and in this state, the package 128B is placed on the surface of the part of the flexible printed circuit board 129 which constitutes the imaging-element mounting section 70, with the respective first connecting terminals 66 coinciding with the second connecting terminals 68. In this manner, both the first connecting terminals 66 and the second connecting terminals 68 are coated with the solder paste.

In this state, the solder paste is heated and melted by a reflow method, so that each of the first connecting terminals 66 and the corresponding one of the second connecting terminals 68 are soldered together.

Figure 28A:
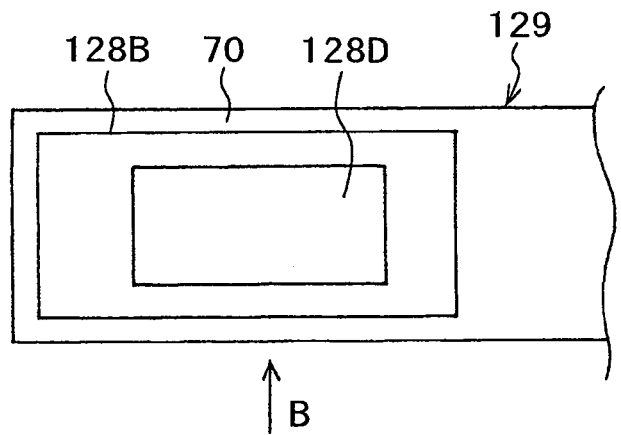
FIG. 28, consisting of FIG. 28A and FIG. 28B, shows an explanatory view showing the positional relationship between the imaging element 128, the flexible printed circuit board 129 and the metal plate 64.
Figure 28B:
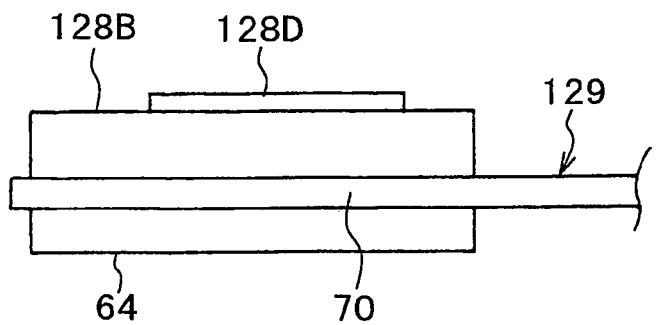

Through this soldering, each of the first connecting terminals 66 and the corresponding one of the second connecting terminals 68 are interconnected by a solder H, as shown in FIGS. 26 and 27, whereby as shown in FIGS. 28(A) and 28(B), the package 128B is mounted on the imaging-element mounting section 70 with the outline of the metal plate 64 and the outline of the package 128B coinciding with each other as viewed in the thicknesswise direction of the package 128B.

Then, the printed circuit board 78 is mounted on the surface of the part of the flexible printed circuit board 129 which constitutes the extending section 72, and the flexible printed circuit board 129 is folded back along the boundary between the part of the flexible printed circuit board 129 which constitutes the extending section 72 and the part of the flexible printed circuit board 129 which constitutes the imaging-element mounting section 70, and as shown in FIGS. 23 and 24, the rear face of the part of the flexible printed circuit board 129 on which the printed circuit board 78 is mounted and the metal plate 64 are superimposed on and secured to each other by an adhesive or the like.

In this manner, the imaging element 128, the flexible printed circuit board 129 and the metal plate 64 are assembled.

According to the present example of the preferred embodiment, the metal plate 64 is mounted on the rear face of the imaging-element mounting section 70 of the flexible printed circuit board 129 at the position where the outline of the metal plate 64 coincides with the outline of the package 128B or the outline of the package 128B is placed in the outline of the metal plate 64, as viewed in the thicknesswise direction of the package 128B. Accordingly, although the package 128B of the imaging element 128 and the part of the flexible printed circuit board 129 which constitutes the imaging-element mounting section 70 are reduced to considerably reduced sizes, the part of the flexible printed circuit board 129 which constitutes the imaging-element mounting section 70 does not undergo deformation even if the part of the flexible printed circuit board 129 is heated during soldering between the first connecting terminals 66 and the second connecting terminals 68, whereby the first connecting terminals 66 and the second connecting terminals 68 can be reliably soldered to one another. Accordingly, it is possible to miniaturize advantageously the lens barrel 10 and the imaging apparatus 100 while reducing the occupation space of the flexible printed circuit board 129.

In addition, since heat that is applied to the part of the flexible printed circuit board 129 during soldering is conducted to each of the first connecting terminals 66 and the second connecting terminals 68 after being averaged by the metal plate 64, it is possible to improve advantageously the quality of soldering.

In addition, since the metal plate 64 is positioned on the rear-face side of the package 128B of the imaging element 128 with the flexible printed circuit board 129 interposed therebetween, it is possible to suppress advantageously spurious radiation which affects the imaging element 128. By grounding the metal plate 64 in particular, it is possible to enhance the effect of suppressing spurious radiation to a far more extent.

In addition, in the present example of the preferred embodiment, since the rear face of the part of the flexible printed circuit board 129 on which the printed circuit board 78 is mounted and the metal plate 64 are superimposed on and secured to each other, it is possible to suppress advantageously spurious radiation which affects the printed circuit board 78. In this case as well, by grounding the metal plate 64, it is possible to enhance the effect of suppressing spurious radiation to a far more extent.

Although in the description of the present example of preferred embodiment reference has been made to a digital still camera as one example of an imaging apparatus, the present invention can be applied to various other imaging apparatuses, such as video cameras, television cameras and the like.

It is therefore to be observed that the present invention is not limited to the above-mentioned examples of preferred embodiments, which are merely descriptions of the present invention in its preferred form under a certain degree of particularity. They are by no means to be construed so as to limit the scope of the present invention. Accordingly, it is to be understood for those of ordinary skill in the art that many other changes, variations, combinations, sub-combinations and the like are possible therein without departing from the scope and spirit of the present invention.

What is claimed is:

1. A lens barrel comprising:
an optical system provided inside a barrel for guiding a subject image;
an imaging element provided on an optical path of the optical system inside the barrel; and
a flexible circuit board connected to the imaging element for performing the transmission of signals between the imaging element and an imaging circuit provided outside the barrel; wherein:
the imaging element comprises:
a package having a plate-like shape;
an imaging unit housed in the package so as to face an obverse face of the package; and
a plurality of first connecting terminals provided on a rear face of the package;
the flexible circuit board comprises:
an imaging-element mounting section;
an extending section extended from the imaging-element mounting section; and
a connecting section provided in an end of the extending section and connected to the imaging circuit;
the imaging-element mounting section comprises a plurality of second connecting terminals provided on a surface of the flexible circuit board so as to correspond to respective first connecting terminals;
the package is mounted on the imaging-element mounting section with the first connecting terminals respectively connected to the second connecting terminals by soldering;
a metal plate capable of retaining its rigidity at a heating temperature by which each of the first connecting terminals and the corresponding second connecting terminal is soldered is provided which, as viewed from a thicknesswise direction of the package, has an outline which is approximately the same as the package, or an outline which is larger than that of the package so that the outline of the package is contained in that of the metal plate; and
the metal plate is mounted at a position where the outline of the metal plate matches the outline of the package or the outline of the package is placed in the outline of the metal plate as viewed from the thicknesswise direction of the package, on the rear face of the imaging-element mounting section.

2. The lens barrel as described in claim 1, wherein:
the package is formed into a rectangular plate-shaped case having its length of a larger dimension than its width; and
a portion of the flexible circuit board which constitutes the imaging-element mounting section is formed with an approximately same width as of the width of the package.

3. The lens barrel as described in claim 1, wherein:
the package is formed into a rectangular plate-shaped case having its length of a larger dimension than its width; and
a portion of the flexible circuit board which constitutes the imaging-element mounting section and a portion of the flexible circuit board which constitutes the extending section is formed with an approximately same width as of the width of the package.

4. The lens barrel as described in claim 1, wherein:
the package is formed into a rectangular plate-shaped case having its length of a larger dimension than its width; and
the metal plate is formed into a rectangular plate-shaped case of same dimensions as of the package.

5. The lens barrel as described in claim 1, further comprising:
a printed circuit board mounted on a surface of the flexible circuit board which constitutes the extending section and including an electronic circuit for communication of signals between the imaging element and the imaging circuit; and
a portion of the flexible circuit board which constitutes a separation between the extending section and the imaging-element mounting section is bent, and a rear face of the flexible circuit board on which the printed circuit board is mounted and the metal plate are mounted superposed with each other.

6. An imaging apparatus including a lens barrel comprising:
an optical system provided inside a barrel for guiding a subject image;
an imaging element provided on an optical path of the optical system inside the barrel; and
a flexible circuit board connected to the imaging element for performing the transmission of signals between the imaging element and an imaging circuit provided outside the barrel; wherein:
the imaging element comprises:
a package having a plate-like shape;
an imaging unit housed in the package so as to face an obverse face of the package; and
a plurality of first connecting terminals provided on a rear face of the package;
the flexible circuit board comprises:
an imaging-element mounting section;
an extending section extended from the imaging-element mounting section; and
a connecting section provided in an end of the extending section and connected to the imaging circuit;
the imaging-element mounting section comprises a plurality of second connecting terminals provided on a surface of the flexible circuit board so as to correspond to respective first connecting terminals;
the package is mounted on the imaging-element mounting section with the first connecting terminals respectively connected to the second connecting terminals by soldering;
a metal plate capable of retaining its rigidity at a heating temperature by which each of the first connecting terminals and the corresponding second connecting terminal is soldered is provided which, as viewed from a thicknesswise direction of the package, has an outline which is approximately the same as the package, or an outline which is larger than that of the package so that the outline of the package is contained in that of the metal plate; and
the metal plate is mounted at a position where the outline of the metal plate matches the outline of the package or the outline of the package is placed in the outline of the metal plate as viewed from the thicknesswise direction of the package, on the rear face of the imaging-element mounting section.

* * * * *